United States Patent
Slonaker

(10) Patent No.: US 8,027,813 B2
(45) Date of Patent: Sep. 27, 2011

(54) METHOD AND SYSTEM FOR RECONSTRUCTING ABERRATED IMAGE PROFILES THROUGH SIMULATION

(75) Inventor: Steven Douglas Slonaker, San Mateo, CA (US)

(73) Assignee: Nikon Precision, Inc., Belmont, CA (US)

( * ) Notice: Subject to any disclaimer, the term of this patent is extended or adjusted under 35 U.S.C. 154(b) by 1271 days.

(21) Appl. No.: 10/538,763

(22) PCT Filed: Feb. 20, 2004

(86) PCT No.: PCT/US2004/004854
§ 371 (c)(1),
(2), (4) Date: Jun. 10, 2005

(87) PCT Pub. No.: WO2005/067514
PCT Pub. Date: Jul. 28, 2005

(65) Prior Publication Data
US 2006/0066841 A1    Mar. 30, 2006

Related U.S. Application Data

(60) Provisional application No. 60/449,514, filed on Feb. 21, 2003.

(51) Int. Cl.
*G06F 17/00* (2006.01)
(52) U.S. Cl. .............. 703/2; 703/6; 356/123; 356/124; 356/138; 356/388; 356/399; 355/55; 355/67
(58) Field of Classification Search ............ 356/123, 356/124, 138, 388, 399; 355/55, 67; 359/1; 703/2, 6
See application file for complete search history.

(56) References Cited

U.S. PATENT DOCUMENTS

| | | | | |
|---|---|---|---|---|
| 4,641,962 A * | 2/1987 | Sueda et al. | ................. | 356/124 |
| 4,890,239 A * | 12/1989 | Ausschnitt et al. | ............. | 430/30 |
| 5,124,927 A * | 6/1992 | Hopewell et al. | ............. | 700/121 |
| 5,528,118 A | 6/1996 | Lee | | |

(Continued)

FOREIGN PATENT DOCUMENTS

JP    8-166475    6/1996

(Continued)

OTHER PUBLICATIONS

Y. Shiode, S. Okada, H. Takamori, H. Matusda, S. Fujiwara, "Method of Zernike Coefficients Extraction for Optics Aberration Measurment", 2002 SPIE, pp. 1453-1464.*

(Continued)

*Primary Examiner* — Kamini S Shah
*Assistant Examiner* — Kibrom Gebresilassie
(74) *Attorney, Agent, or Firm* — Andrew M. Calderon; Roberts Mlotkowski Safran & Cole, P.C.

(57) ABSTRACT

A system and method of calculating estimated image profiles. The system and method includes providing lens characteristic data and performing simulation calculations for various levels of aberration components using the lens characteristic data. A response surface functional relation is built between selected variables of the lens characteristics, in particular the lens aberration components, and the Image Profile using the simulation calculations. Evaluation is then performed on the arbitrary specified aberration values of a lens in relation to the response surface functional relations to provide a calculated estimate of the Image Profile for the specified aberration values. A machine readable medium and exposure apparatus are also provided.

17 Claims, 29 Drawing Sheets

U.S. PATENT DOCUMENTS

| | | | | |
|---|---|---|---|---|
| 5,561,297 | A * | 10/1996 | Engdahl | 250/369 |
| 5,623,853 | A | 4/1997 | Novak et al. | |
| 5,668,672 | A | 9/1997 | Oomura | |
| 5,689,377 | A | 11/1997 | Takahashi | |
| 5,781,430 | A * | 7/1998 | Tsai | 700/28 |
| 5,835,275 | A | 11/1998 | Takahashi et al. | |
| 5,874,820 | A | 2/1999 | Lee | |
| 5,892,117 | A | 4/1999 | Theriot | |
| 5,953,106 | A * | 9/1999 | Unno et al. | 355/55 |
| 6,115,108 | A * | 9/2000 | Capodieci | 355/77 |
| 6,248,485 | B1 | 6/2001 | Cuthbert | 430/30 |
| 6,272,392 | B1 * | 8/2001 | Capodieci | 700/110 |
| 6,381,564 | B1 * | 4/2002 | Davis et al. | 703/22 |
| 6,437,858 | B1 * | 8/2002 | Kouno et al. | 356/124 |
| 6,493,063 | B1 * | 12/2002 | Seltmann et al. | 355/53 |
| 6,563,566 | B2 | 5/2003 | Rosenbluth | |
| 6,563,573 | B1 * | 5/2003 | Morohoshi et al. | 356/124 |
| 6,653,032 | B2 * | 11/2003 | Miwa et al. | 430/30 |
| 6,809,797 | B2 * | 10/2004 | Baselmans et al. | 355/52 |
| 6,839,125 | B2 * | 1/2005 | Hansen | 355/67 |
| 6,934,930 | B2 * | 8/2005 | Blatchford et al. | 716/53 |
| 6,943,882 | B2 * | 9/2005 | Renwick et al. | 356/399 |
| 7,092,845 | B2 * | 8/2006 | Keane et al. | 702/182 |
| 7,095,481 | B2 * | 8/2006 | Morohoshi | 355/52 |
| 7,215,408 | B2 * | 5/2007 | Hamatani et al. | 355/52 |
| 7,230,252 | B2 * | 6/2007 | Muraki et al. | 250/396 R |
| 7,261,985 | B2 * | 8/2007 | Smith et al. | 430/30 |
| 7,268,937 | B1 * | 9/2007 | Andersen et al. | 359/359 |
| 7,747,101 | B2 * | 6/2010 | Matsuzawa et al. | 382/275 |
| 2002/0015158 | A1 * | 2/2002 | Shiode et al. | 356/614 |
| 2002/0041377 | A1 * | 4/2002 | Hagiwara et al. | 356/399 |
| 2002/0057345 | A1 * | 5/2002 | Tamaki et al. | 348/207 |
| 2002/0062206 | A1 * | 5/2002 | Liebchen | 703/6 |
| 2002/0076629 | A1 * | 6/2002 | Miwa et al. | 430/30 |
| 2002/0100013 | A1 * | 7/2002 | Miwa et al. | 716/21 |
| 2002/0159040 | A1 * | 10/2002 | Hamatani et al. | 355/52 |
| 2002/0191165 | A1 * | 12/2002 | Baselmans et al. | 355/52 |
| 2003/0004679 | A1 * | 1/2003 | Tryon et al. | 702/182 |
| 2003/0081722 | A1 * | 5/2003 | Kandaka et al. | 378/70 |
| 2003/0090681 | A1 * | 5/2003 | Jones et al. | 356/614 |
| 2003/0091913 | A1 * | 5/2003 | Shiode | 430/22 |
| 2003/0215965 | A1 * | 11/2003 | Grodnensky et al. | 438/16 |
| 2003/0223630 | A1 * | 12/2003 | Adel et al. | 382/145 |
| 2004/0053148 | A1 * | 3/2004 | Morohoshi | 430/30 |
| 2004/0119957 | A1 * | 6/2004 | Renwick et al. | 355/53 |
| 2004/0137677 | A1 * | 7/2004 | Lowisch et al. | 438/232 |
| 2004/0167748 | A1 * | 8/2004 | Zhang et al. | 702/185 |
| 2004/0223636 | A1 * | 11/2004 | Edic et al. | 382/131 |
| 2005/0010878 | A1 * | 1/2005 | Blatchford et al. | 716/4 |
| 2005/0143962 | A1 * | 6/2005 | Keane et al. | 703/1 |
| 2005/0199341 | A1 * | 9/2005 | Delp et al. | 156/345.24 |
| 2006/0009951 | A1 * | 1/2006 | Tryon et al. | 702/185 |
| 2006/0114437 | A1 * | 6/2006 | Akhssay et al. | 355/55 |
| 2006/0126046 | A1 * | 6/2006 | Hansen | 355/55 |
| 2007/0035784 | A1 * | 2/2007 | Ariga et al. | 358/461 |
| 2007/0115457 | A1 * | 5/2007 | Matsuzawa et al. | 356/124 |
| 2009/0125005 | A1 * | 5/2009 | Chernyak et al. | 606/5 |

FOREIGN PATENT DOCUMENTS

| | | |
|---|---|---|
| JP | 8-171054 | 7/1996 |
| JP | 8-330224 | 12/1996 |
| JP | 8-334695 | 12/1996 |

OTHER PUBLICATIONS

T. Nakashima, K. Higashi, and S. Hirukawa, "Ipmact of Zernike cross-term on linewidth control" 2002 SPIE, pp. 33-43.*

S. Sloneker, "Further pursuit of correlation between lens aberration content and imaging performance" 2001 SPIE, pp. 1394-1403.*

Y. Chiba, and K. Takahashi, "New generation projection optics for ArF lithography" 2002 SPIE, pp. 679-686.*

T. Nakashima, S. D. Slonaker, T. Kudo, and S. Hirukawa, "Evaluation of Zernike sensitivity method for CD distribution" Jun. 25, 2003 SPIE, pp. 1600-1610.*

T. Nakashima, S. D. Slonaker, T. Kudo, and S. Hirukawa, "Evaluation of Zernike sensitivity method for CD distribution", vol. 5040 (2003), 2003 SPIE (Jun. 2003).*

Nakashima, T., "Impact of Zernike cross-term on linewidth control", SPIE vol. 4691, 2002, Jul. 15, 2002, pp. 33-43.

Shiode, Y., "Method of Zernike coefficients extraction for optics aberration", SPIE vol. 4691, 2002, pp. 1453-1464, Abstract (pp. 1453), 2.2 Illumination source Design (pp. 1454-1455).

Nakashima, T., "Evaluation of Zernike sensitivity method for CD distribution", SPIE vol. 5040, 2003, pp. 1600-1610.

Slonaker, S., "Further pursuit of correlation between lens aberration content and imaging performance", SPIE vol. 4346, 2001, pp. 1394-1403.

International Search Report (PCT/ISA/210) for International Application No. PCT/US04/04854.

International Preliminary Examination Report dated Oct. 6, 2010 for corresponding PCT Application PCT/US2004/004854.

* cited by examiner

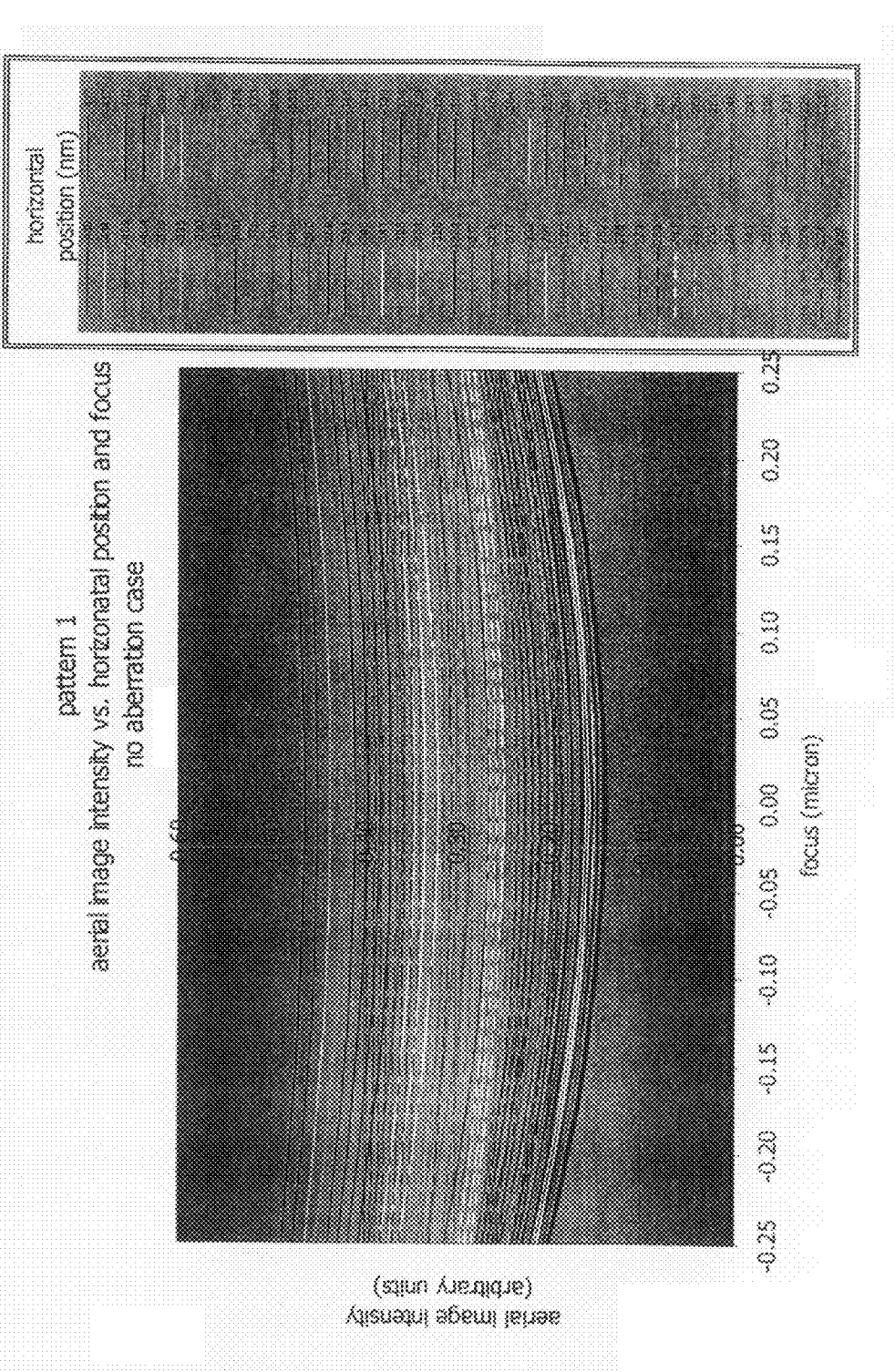

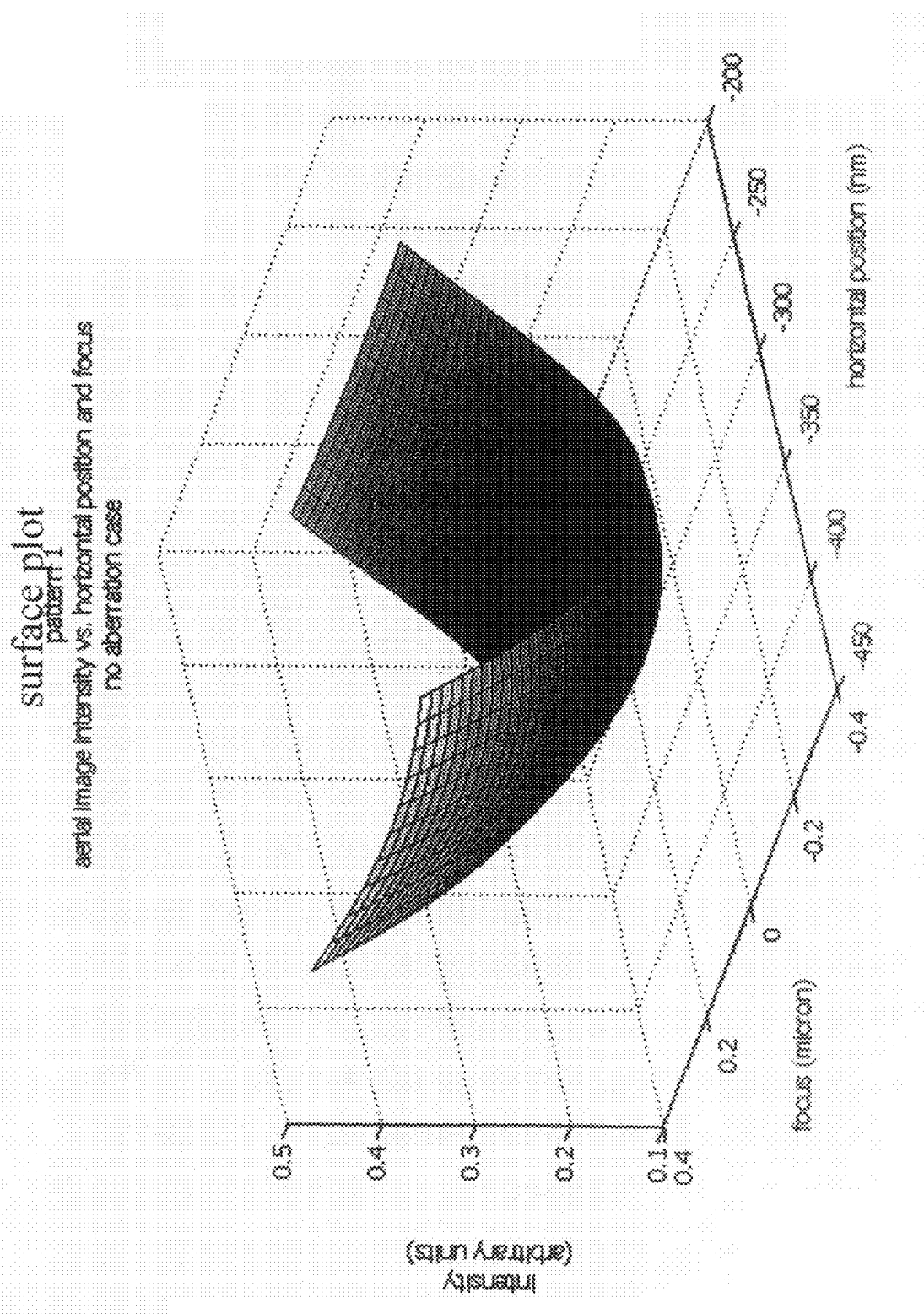

METHOD AND SYSTEM FOR RECONSTRUCTING ABERRATED IMAGE PROFILES THROUGH SIMULATION

CROSS REFERENCE TO RELATED APPLICATIONS

The present application is a U.S. national stage application of PCT/US04/04854, filed on Feb. 20, 2004, which claims priority to U.S. Provisional Application Serial No. 60/449,514, filed on Feb. 21, 2003.

BACKGROUND OF THE INVENTION

1. Field of the Invention

The invention generally relates to a system and method for calculating image profiles on a surface and, more particularly, to a method and system to calculate estimated image profiles resulting from imaging in the presence of lens aberrations.

2. Background Description

The calculation of image profiles in the presence of lens aberrations has become a routine requirement. Image profiles come in many forms, with the aerial image profile being the most fundamental. The aerial image profile is defined as a description of the variation of optical energy (e.g. represented as "amplitude" or "intensity") with physical location within or nearby some plane being considered, herein defined as the "image plane". This optical image profile is known to impact all subsequent forms of image profile, such as the image profile within the developed photoresist, and the further subsequent image profile etched into a process layer on the wafer. Hence, the ability to simulate the impact of lens aberrations on the aerial image profile is a key requirement to being able to simulate any other image profile associated with later steps in the semiconductor manufacturing process.

These calculations of simulated aerial image profiles are important in the field of photolithography, especially in view of the decreased size of printed dimensions on a wafer surface. By way of example, technologies have reached beyond the 100 nm scale achieving, in some instances, over (100,000,000) transistors on a single wafer chip.

But to achieve such densities, it is important, for example, to adjust the projection lenses within the projection lithography tools for lens aberrations at several steps within the lens fabrication process, as well as during final installation at the end-user's wafer fabrication facility. This lens adjustment process may make use of a simulation calculation. This will ensure that "adjustment state" of a lens, as represented by the measurements of its lens aberration content, is optimum for the imaging of a particular specified target optimization pattern. Thus, adjustments to the lens can be prescribed and made throughout the fabrication process, and during the installation at the customer facility as well, while ensuring that the delivered image profile is within design parameters.

Many simulation packages are available commercially, but these simulation packages are exceptionally computationally intensive and thus are not very practical in the lens adjustment application described above. This is primarily due to the fact that the above typical lens adjustment application of image simulation would require new simulation calculations to be executed for each and every considered change of any one or more lens element positions. Since the mathematical optimization routines typically applied utilize many thousands of "trial adjustments" while they hunt for the best possible combination of all adjustments, this translates to many thousands of required image simulation calculations, if the image profile is to be used as a metric to evaluate the "goodness" of each considered lens adjustment combination.

A typical current image simulation technique, as described in more detail below, uses a very complex calculation for simulating an image profile on the wafer. However, with this simulation technique, a new calculation of a propagated aerial image is required each and every time a different set of aberration component values (most typically represented as Zernike Polynomial coefficient values, in current practice) is to be considered by the simulation environment. That is, for each set of new aberration components for which a corresponding image profile is desired:

(i) a mathematical series (or the coefficients of an agreed-upon series) must be provided as input, describing the aberrations in the lens when imaging at a single exposure field position to be considered;

(ii) an aberration calculation is performed for each new set of aberration components (i.e., the value of the series representing the aberration is calculated at each position within the pupil plane of simulated lens being considered); and (iii) a final image simulation calculation is performed using the new pupil-plane aberration representation.

But, this sort of "full" image simulation calculation is very time consuming and mathematically intensive. And since, for example, in the lens adjustment application mentioned above, many thousands of different possible lens adjustment trials will be considered, and for each trial lens adjustment many different positions within the exposure field (each with an independent aberration condition/series) must be considered, it is clear that executing full image simulations at each field point for every trial lens adjustment would not be efficient enough to be practical. If it is desired to use the simulated image profile as a metric to judge and rank the "goodness" of one particular lens adjustment state to another, a faster calculation of image profiles is necessary.

Partially Coherent Imaging Theory as typically applied in the field of photolithography image simulation is summarized below, as an illustration of the specific steps required in the current practice version of atypical calculation of an aberrated image profile. Specifically, to date the theoretical analysis of projection imaging (e.g. Koehler matched illumination, diffraction-limited projection lens, etc., as in photolithography) has primarily treated the illumination source as "quasi-monochromatic," with each point in the illumination source yielding the image of any considered object-point "coherently". The field of partial coherence has developed primarily as a study of the variation in imaging with a variation in the distribution of such illumination source-points.

By way of example, each illuminator source-point yields a spatial frequency spectrum on the projection lens entrance pupil sphere which is slightly shifted (in space) with respect to the spectrum arriving from a neighboring source-point. The result is that a fixed-position pupil-aperture passes a different "chunk" of the total spatial frequency spectrum emitted per object (for each illuminator source-point considered). In other words, this is one of the reasons for aberrations, which will impact on the image profile. And, when applying this method (or those related), each consideration of a new set of aberration coefficients requires a new mathematical treatment of applying the phase shift induced by the aberrations prior to the calculation of the final image profile. Under prior art which utilized such methods, this recalculation of the propagation of light from the pupil plane of the lens to the image plane is indeed executed each time a new or different set of aberration coefficients are to be considered.

As described above, to account for the many problems associated with the lens and light source, current imaging models sum the "intensity-image" contributions from each illumination source-point to build the final image irradiance ("intensity") profile. A typical functional representation of a partially coherent image intensity begins with:

$$1)\ I(\vec{r}, z) = \int_{sourceS} d\vec{\rho}_0 J(\vec{\rho}_0)|E(\vec{r}, z; \vec{\rho}_0)|^2 = \int_{sourceS} d\vec{\rho}_0 J(\vec{\rho}_0) I_c(\vec{r}, z; \vec{\rho}_0)$$

where,

E is the electric field whose squared modulus becomes the intensity, both of which are shown to be a function of the source point at position $\vec{\rho}_0$;

$J(\vec{\rho}_0)$ is the effective illumination source distribution in the lens pupil, so in effect defines the attenuation of amplitude and/or shift of initial phase per source point being considered;

$I_c$ is the coherent image from the single source point;

$\vec{r}$ defines the lateral local image position vector (i.e. x/y position) in the image plane; and z is the axial image position.

Further expanding the electric field portion:

$$2)\ I(\vec{r}, z) = \int_{sourceS} d\vec{\rho}_0 J(\vec{\rho}_0)$$
$$\left| \int_{\geq ExitPupil} d\vec{\rho} \tilde{O}(\vec{\rho} - \vec{\rho}_0) P(\vec{\rho}) F(\vec{\rho}, z) e^{-ik_0 \vec{r}\cdot\vec{\rho}} e^{-ik_0 z_0 \gamma} e^{-ik_0 W(\vec{\rho})} \right|^2$$

$$3)\ I(\vec{r}, z) =$$
$$\int_{sourceS} d\vec{\rho}_0 J(\vec{\rho}_0) \times \int\int_{\geq ExitPupil} d\vec{\rho} d\vec{\rho}' \tilde{O}(\vec{\rho} - \vec{\rho}_0) \tilde{O}*(\vec{\rho}' - \vec{\rho}_0) P(\vec{\rho})$$
$$P^*(\vec{\rho}') F(\vec{\rho}, z) F^*(\vec{\rho}', z) \cdot e^{-ik_0 \vec{r}\cdot(\vec{\rho}-\vec{\rho}')} e^{-ik_0 z_0(\gamma-\gamma')} e^{-ik_0[W(\rho)-W(\vec{\rho})]}$$

In Equations (2) and (3), the double integral accounts for the squaring process, with integration being taken over the lens "exit pupil transmission function" (the explicit inclusion of the lens transmission function relaxes the requirements on the limits of integration, with the result that the limits need only be greater than or equal to the region of space containing the lens aperture). Additionally, $\tilde{O}(\vec{\rho})$ is the Fourier Transform of the object transmission function;

$P(\vec{\rho})$ is the lens transmission pupil function which is generally a one/zero real-valued function (but it is not forced to be so); and $F(\vec{\rho}, z)$ is the modification of the aerial image when considered in a thin film (required when modeling an image in photoresist).

Also, the exponential terms describe the propagation of the fields according to pupil position, with the first exponential containing the x-y functionality, the second exponential handling the z-propagation, and the last exponential mapping the phase aberration from a reference sphere in the lens exit pupil.

When viewed in conjunction with the first integral, the shifted version of the object's spatial frequency spectrum $\tilde{O}(\vec{\rho})$ combines to yield a convolution of it with the effective illumination source distribution. It is the nature of this effective source distribution function $J(\vec{\rho}_0)$ which drives whether any mutual interaction among different effective source points will exist or not. As discussed, in all current photolithography imaging models, the squared modulus of the electric field is taken for each source point considered, and the sum of these "illuminator source-point-based intensity profiles" is taken as the total image. The justification for this relates to the nature of the source. However, the very fundamentals of this sort of calculation technique demands recalculation of the light's path from the pupil of the projection lens to the image plane each and every time a change is made in the aberration content of the lens.

In the current practice of image simulation, commercial software packages exist that provide the capability of "image profile estimation" (e.g., Prolith™ by KLA-Tencor). The core function that these software routines provide is the calculation of a propagated aerial image, with the optional follow-up calculation of a "developed image profile in resist". Said otherwise, these software routines may calculate (i) the image profile transmitted by a lens which contains an input description of its aberration content (e.g., a set of Zernike coefficients), and (ii) the resultant image profile in the resist (either before or after development of the resist).

All such software programs, however, require a new calculation of a propagated aerial image each and every time a different set of aberration component values is to be considered. As discussed, this aberration calculation is necessarily complicated and still very time consuming. And when considered in light of applications which may require many tens or even hundreds of thousands of full image simulation calculations, such as the lens adjustment application described previously, it is seen that the application of such currently available software to this task would be prohibitive to achieving a result within allotted time constraints.

The invention is directed to overcoming one or more of the problems as set forth above.

SUMMARY OF THE INVENTION

In a first aspect of the invention, a method includes calculating estimated image profiles. The method includes providing lens imaging configuration characteristic data into an existing 'full image simulator' and performing simulation calculations for various levels of input aberration components. A response surface functional relation is built between variables of the lens characteristics and the resulting image profile using the simulation calculations. 1

In embodiments of the invention, the imaging configuration includes lens data, illumination data and pattern data. The illumination data includes at least one of illumination distribution and illumination wavelength, and the lens data includes at least one of lens aberration, numerical aperture, pupil filters and lens configuration. Additionally, the pattern data includes object (reticle pattern) layout. Additional information such as, for example, focus and pattern bias information may also be used.

In another aspect of the invention, the simple linear relationship described above between each aberration coefficient and the resulting change in the image profile is not assumed to adequately describe the image simulation process. In those circumstances, it has been seen that the residual error (between linearly reconstructed image profile and full simulation image profile) can be significantly accounted for through the inclusion of "cross-terms" added to the image profile calculation.

In another aspect of the invention, a method is provided for representing the Image Profile using a basis 'zero aberration Image Profile' (that is, an image profile simulated when all aberration values are set to zero) and set of functions which describe a change to the basis plot in the presence of non-zero aberration coefficients. The method includes the execution of simulation calculations for various levels of each aberration component. It then functionalizes the change in the image profile due to each aberration component (i.e., builds an interpolation routine which fits the set of discrete individual results into a general result represented by a function). One example of fitting the response of the 'setup' image simulations to the response of the change in Image Profile is shown below, in this case using an order fitting function expressed as:

$$I_{spx}(x) = b_0 + b_1 x + b_2 x^2 + b_3 x^3 + \ldots + b_n x^n$$

This particular example is describing the image profile Intensity at a single given position x in the image field, as a function of the coefficient values $b_0 \ldots b_n$. Thus in this example, I(x) describes the intensity versus horizontal position (=one form of Image Profile) at some image plane of consideration. The method further includes expressing a change of the coefficients $b_0 \ldots b_n$ described by an order fitting function as:

$$b_{i(with\_aberration)} = b_{i(w/o\_aberration)} + \sum_{j=2}^{Zn} \Delta b_i(cj)$$

$$= b_{i(w/o\_aberration)} + \sum_{j=2}^{Zn} \varphi_{0(i,j)} + \varphi_{1(i,j)} c_j + \varphi_{2(i,j)} c_j^2 +$$

$$\varphi_{3(i,j)} c_j^3 + \ldots + \varphi_{n(i,j)} c_j^n$$

These functions describe the change in the image profile due to a change in the aberration coefficients used as input.

The curves described by these equations are the response surface functional relations that have been built using the setup simulation calculations. The impact from all specified aberration coefficients or combinations thereof may be summed up from the component response surface functional relations developed for each aberration component individually, and potentially to include cross-term.

In another aspect of the invention, an exposure apparatus includes an illumination system that projects radiant energy through a mask pattern on a reticle R that is supported by and scanned using a wafer positioning stage and at least one linear motor that positions the wafer positioning stage. The exposure apparatus also includes a system for providing optimal image profiling, including a mechanism for, in no specific order:

(i) providing lens characteristic data;
(ii) performing simulation calculations for various levels of aberration components using the lens characteristic data; and
(iii) building response surface functional relations between variables of the lens characteristics using the simulation calculations.

In an aspect of the invention, a mechanism may be provided for evaluating specified aberration values of a lens in terms of the impact on image profile through the response surface functional relations to judge the "goodness" or "badness" of each considered lens adjustment combination, where each lens adjustment combination to be considered is defined as a new set of aberration coefficients. From the aberration coefficients, a direct calculation of the image profile through application of the present invention is executed.

In yet another aspect of the invention, a device is manufactured with the exposure apparatus. Also, in an aspect of the invention, a wafer on which an image has been formed using the exposure apparatus is provided.

In still a further aspect of the invention, a system is provided for achieving optimal image profiles using specified aberration components. The system includes components for:

(i) performing simulation calculations for various levels of aberration components using image configuration characteristic data (e.g., lens Numerical Aperture setting, the Illumination Distribution utilized, physical pattern information such as line shape, size, and pitch, whether the pattern includes 'phase shifting' features or not, etc);
(ii) building response surface functional relations between variables of the lens characteristics using the simulation calculations (e.g., image profile change as a function of focus change or lens Numerical Aperture change or lens element position change, etc.); and
(iii) evaluating specified aberration values of a lens in relation to the response surface functional relations to provide lens adjustment data calculated to be optimized for minimizing the degradation of the image profile, in consideration of the impact aberrations will have upon the image profile, according to the specified aberration values.

In yet a further aspect of the invention, a machine readable medium containing code for adjusting a lens is provided, and the present invention can provide feedback into that code based upon its calculations of image profiles, and regarding which lens adjustment prescription can yield the optimum image profile while satisfying all user constraints and targets. The machine readable medium includes the functionalities of the method of the inventions.

BRIEF DESCRIPTION OF THE DRAWINGS

The foregoing and other objects, aspects and advantages will be better understood from the following detailed description of embodiments of the invention with reference to the drawings, in which:

FIGS. 1a and 1b graphically show a set of data points representing the results of set-up full image simulation calculations, plotted as intensity vs. position, for various values of focus (each line in the graph represents the image profile at a different focus level);

FIG. 2 graphically shows a set of data points representing a response surface generated in accordance with the invention, following the fitting and reconstruction of image profile, plotted as a surface plot of intensity (vertical axis) vs. position and focus;

DETAILED DESCRIPTION OF EMBODIMENTS OF THE INVENTION

The invention is directed to a system and method for calculating estimated image profiles resulting from imaging in the presence of lens aberrations. The system and method significantly reduces processing times for calculating image profiles by executing only the evaluation of a simple function at the values specified for the aberration components. In more specificity, the system and method makes use of propagated aerial image calculations in a "setup" phase; however, this is performed only once for a given imaging configuration, which significantly reduces the need for additional processing resources during the subsequent calculation of image profiles for many various combinations of aberration components (representing various field positions within an exposure field, as well as various lens adjustment "states", i.e., combinations of lens element adjustments). These "setup" simulations may be used as input data to load an "Image Profile Calculator" that is realized by the invention.

Following the setup simulations and loading of the Image Profile Calculator, all further Image Profiles may then subsequently be directly calculated using the established "aberration sensitivities". By such direct calculation via evaluation of a fixed function, the invention effectively bypasses the need to have direct access to a commercial image simulation software package (at any time following the execution of the setup simulations).

The system and method of the invention may be applied equally to at least:
  (i) the determination and application of response-surface fitting of the aerial image intensity or amplitude profile as a function of input aberration component values;
  (ii) the response surface fitting of final etched image profiles; or
  (iii) any other interim image profile that it is desired to describe as a function of aberration component values, such as, for example, "Aerial Image captured in Resist Material Image Profile", "Developed Resist Image Profile", "Final Etched Image Profile" and the like, discussed below in detail.

It should also be understood that any accurate simulation programs may be used to provide input data for the system and method of the invention; however, it is equally possible to manually perform the same aerial image profile calculations, thus bypassing any interaction at all with such commercial image simulation software programs.

Figure 1A:
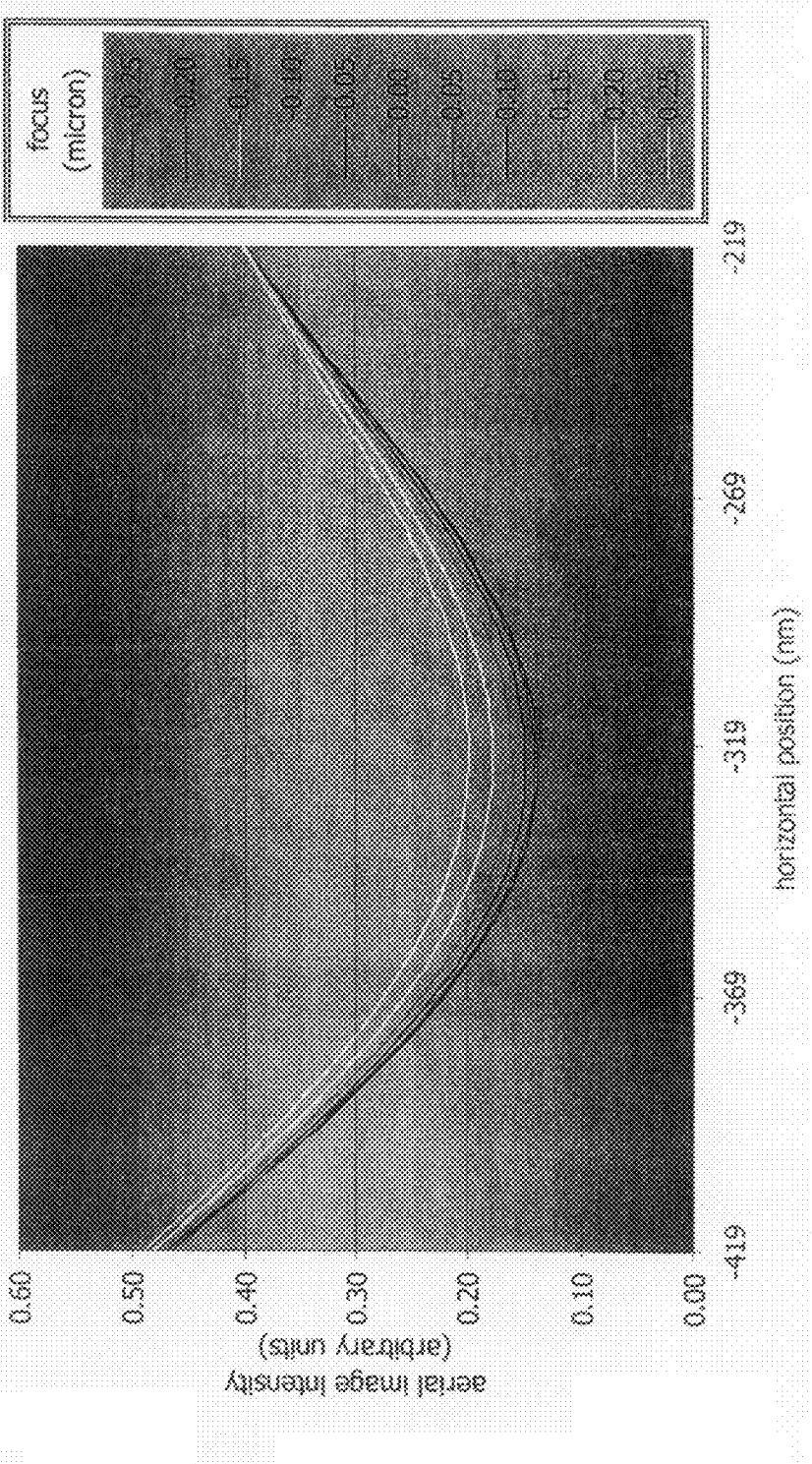

In other words, a direct mathematical relationship is developed connecting the input values of the aberration coefficients and the resulting image profile shape or plot. These set-up image simulations are executed for any specific pattern and illumination distribution (e.g., defined criteria) which is desired to be used as a judgment or optimization metric during the lens adjustment process. In effect, the image profile itself in the absence of all aberrations is considered to be the basis image profile, and can be thought of in the form of a plot of optical energy (e.g., amplitude or intensity) versus position, as shown in FIG. 1a.

Separately, through evaluation of the relationships between specified aberration values and the resulting image profile surface plots, functions can be fit and developed which describe a one-to-one relationship between a change in value of any single Zernike Coefficient and a resulting change in the delivered image profile. So in the application of this aspect of the invention, the reconstruction of a final image profile may be provided through the summing of the various aberration component profiles, each determined according to the magnitude of its aberration coefficient.

In Equation (4) below, the aberration content of the lens (at one single considered field point) is represented by the sum of Zernike Components, $Z_i(r,\theta)$.

$$W(r, \theta)_{total} = \sum_{i=2}^{37} A_i Z_i(r, \theta) \qquad (4)$$

where:
  $W(r, \theta)$ is the total aberration represented as phase error as a function of radial position (r) and azimuth angle ($\theta$) in the pupil plane of the lens;
  $A_i$ is the "Zernike coefficient" associated with each Zernike Aberration Component polynomial, $Z_i(r,\theta)$.
In current practice, it is necessary to first calculate the sum $W(r, \theta)$ prior to executing the calculation of image profile information; however, the invention bypasses this requirement.

The Zernike polynomial terms corresponding to Zernike number 2 though Zernike number 37 are shown in Table 1 for reference. This fringe Zernike set is provided for illustrative and reference purposes only for implementing the system and method of the invention. These data points are not be considered a limiting feature of the invention.

TABLE 1

"Fringe" Zernike set (=first 36 terms of the standard Zernike Expansion plus term #49 from full expansion)

| coefficient label | Zernike Polynomial | zernike # | multiple of theta used | highest occurring power of r | radial symmetry in lens pupil |
|---|---|---|---|---|---|
| z1 | 1 | 1 | 0 | 0 | N/A |
| z2 | =z2*r*cos(q) | 2 | 1 | 1 | odd |
| z3 | =z3*r*sin(q) | 3 | 1 | 1 | odd |
| z4 | =z4*(2*r^2 − 1) | 4 | 0 | 2 | even |
| z5 | =z5*r^2*cos(2*q) | 5 | 2 | 2 | even |
| z6 | =z6*r^2*sin(2*q) | 6 | 2 | 2 | even |
| z7 | =z7*(3*r^3 − 2*r)*cos(q) | 7 | 1 | 3 | odd |
| z8 | =z8*(3*r^3 − 2*r)*sin(q) | 8 | 1 | 3 | odd |
| z9 | =z9*(6*r^4 − 6*r^2 + 1) | 9 | 0 | 4 | even |
| z10 | =z10* r^3*cos(3*q) | 10 | 3 | 3 | odd* |
| z11 | =z11*r^3*sin(3*q) | 11 | 3 | 3 | odd* |
| z12 | =z12* (4* r^4 − 3* r^2)*cos(2* q) | 12 | 2 | 4 | even |
| z13 | =z13* (4* r^4 − 3* r^2)*sin(2* q) | 13 | 2 | 4 | even |
| z14 | =z14* (10*r^5 − 12*r^3 + 3*r)*cos(q) | 14 | 1 | 5 | odd |
| z15 | =z15* (10*r^5 − 12*r^3 + 3*r)*sin(q) | 15 | 1 | 5 | odd |
| z16 | =z16* (20*r^6 − 30* r^4 + 12* r^2 − 1) | 16 | 0 | 6 | even |
| z17 | =z17* r^4*cos(4*q) | 17 | 4 | 4 | even* |

TABLE 1-continued

"Fringe" Zernike set (=first 36 terms of the standard Zernike Expansion plus term #49 from full expansion)

| coefficient label | Zernike Polynomial | zernike # | multiple of theta used | highest occurring power of r | radial symmetry in lens pupil |
|---|---|---|---|---|---|
| z18 | =z18* r^4* sin(4* q) | 18 | 4 | 4 | even* |
| z19 | =z19* (5*r^5 − 4*r^3)*cos(3*q) | 19 | 3 | 5 | odd* |
| z20 | =z20* (5*r^5 − 4*r^3)*sin(3*q) | 20 | 3 | 5 | odd* |
| z21 | =z21* (15*r^6 − 20*r^4 + 6*r^2)*cos(2*q) | 21 | 2 | 6 | even |
| z22 | =z22* (15*r^6 − 20*r^4 + 6*r^2)*sin(2*q) | 22 | 2 | 6 | even |
| z23 | =z23* (35*r^7 − 60*r^5 + 30*r^3 − 4*r)*cos(q) | 23 | 1 | 7 | odd |
| z24 | =z24* (35*r^7 − 60*r^5 + 30*r^3 − 4*r)*sin(q) | 24 | 1 | 7 | odd |
| z25 | =z25* (70*r^8 − 140*r^6 + 90*r^4 − 20*r^2 + 1) | 25 | 0 | 8 | even |
| z26 | =z26*r^5*cos(5*q) | 26 | 5 | 5 | odd* |
| z27 | =z27* r^5*sin(5* q) | 27 | 5 | 5 | odd* |
| z28 | =z28* (6* r^6 − 5* r^4) *cos(4* q) | 28 | 4 | 6 | even* |
| z29 | =z29* (6* r^6 − 5* r^4) *sin(4* q) | 29 | 4 | 6 | even* |
| z30 | =z30* (21* r^7 − 30* r^5 + 10* r^3)*cos(3* q) | 30 | 3 | 7 | odd* |
| z31 | =z31* (21* r^7 − 30* r^5 + 10* r^3)*sin(3* q) | 31 | 3 | 7 | odd* |
| z32 | =z32* (56* r^8 − 105* r^6 + 60* r^4 − 10* r^2)* cos(2* q) | 32 | 2 | 8 | even |
| z33 | =z33* (56* r^8 − 105* r^6 + 60* r^4 − 10* r^2)* sin(2* q) | 33 | 2 | 8 | even |
| z34 | =z34* (126* r^9 − 280* r^7 + 210* r^5 − 60* r^3 + 5*r)* cos(q) | 34 | 1 | 9 | odd |
| z35 | =z35* (126* r^9 − 280* r^7 + 210* r^5 − 60* r^3 + 5*r)* sin(q) | 35 | 1 | 9 | odd |
| z36 | =z36* (252 r^10 − 630* r^8 + 560* r^6 210* r^4 + 30* r^2 − 1) | 36 | 0 | 10 | even |
| z37 | =z37*(924*r^12 − 2772*r^10 + 3150*r^8 1680*r^6 + 420*r^4 − 42*r^2 + 1) | 37 | 0 | 12 | even |

*those Zernike terms which represent symmetry in the lens pupil resulting from 3-theta functionality or higher, thus without direct association with standard imaging phenomena In one example, each Zernike component is multiplied by an associated coefficient, $A_i$, which, in effect, is the measure of "how much" of each associated aberration component is added into the total. In the simplest application of the invention, the image profile is determined as an independent function of each different aberration component coefficient value.

As a visual example, Zernike #2 ($Z_2 = A_2 \cos\theta$) is considered here, and in FIGS. 3a-3k and FIGS. 4a-4k (Example plots of Image Profile as a function of $A_2$ value are presented in FIGS. 3a-3k and FIGS. 4a-4k). The variation of the Image Profile plot as a function of the variation in the value of $A_2$ is determined through the stepwise simulations described above and plotted in the Figures. These two sets of graphs contain identical information, simply viewed from different perspectives. This particular aberration causes a shift of the Image Profile position proportional to the value of the coefficient $A_2$.

A function is built (through fitting techniques to represent this change of surface plot as a function of $A_2$ value. This is represented as the function 'surfA$_2$(A$_2$,x,y)' in Equation (5), describing a surface plot (e.g., image intensity or amplitude as a function of x/y position within the image plane region) which varies as a function of the input variable $A_2$. It is only necessary to supply a value of $A_2$, and the shape of the surface function is fully known and described. Likewise, a similar function is built for each of the various aberration components and their associated coefficients, each providing a full description (in the form of a mathematical function) of the image profile plot that varies depending upon the input value of the given coefficient.

Thus, when presented with a set of Zernike Coefficients representing the aberration at a specified field point, the invention may calculate the final "aberrated image profile" through the simple summing of each of the separate image profile plots, each of which is responding only to a single aberration coefficient value. In this application and aspect of the invention, a linear response is assumed between the various aberration coefficients. This is supported mathematically and many times in practice due to the mathematical orthogonality between all of the terms of the Zernike Polynomial series. Mathematical orthogonality basically describes the fact that each of the various terms are unaffected by a change in value of any of the other terms.

So the invention is able to calculate an image profile for any presented set of aberration coefficients, while not requiring any further "full image simulation" calculations. In other words, the task of estimating the image profile in the presence of many different combinations of aberration coefficients has gone from one which required an image simulation calculation for each different set of coefficients, to one which requires the much simpler "look-up" of the direct relationship between the value of each coefficient and the component impact it has on the resulting image profile, and in implementations, summing the component Image Profiles to yield a final resultant "aberrated image profile".

In a further application and extension of the response surface functional relationship construction process discussed thus far, the linear relationship described above between each aberration coefficient and the resulting change in the image profile can also be assumed not to adequately describe the image simulation process. Basically, there are occasions where the 'one-term-to-one-impact' linear decomposition method described above and in Equation (4) is not entirely adequate. This is determined when the image profile calculated by this method deviates significantly from the result of a full image simulation calculation. In such circumstances, the residual error (between linearly reconstructed image profile and full simulation image profile) can be significantly accounted for through the inclusion of "cross-terms" added to the image profile calculation. Simply stated, such cross-terms are used to fill in the gaps when it is seen that the change in a given image profile as a result of the change of 2 coefficients is actually greater than the change predicted from the sum of each of the coefficients' impact individually. Equation (5) shows the inclusion of a cross-term relating the Zernike components labeled Z7 and Z14, Z8 and Z15, and the pair of Z9 and Z16.

$$surf(A_2 \ldots A_{37}, x, y)_{image\_profile} = surf_{A2}(A2, x, y) + surf_{A3}(A3, x, y) + \quad (5)$$
$$\ldots + surf_{A37}(A37, x, y) + surf_{A7A14}(A7, A14, x, y) +$$
$$surf_{A8A15}(A8, A15, x, y) + surf_{A9A16}(A9, A16, x, y)$$

This extension of the invention is a matter of extending the 'Image Profile Reconstruction' technique described herein to include both linear recomposition of terms as well as non-linear and coupled recomposition of terms, as just described. In both cases, the same set of inputs is used (i.e., the coefficients of the Zernike Series, A1-A37). The only difference is that the second form of 'reconstruction function' includes more terms than the linear form.

The series representation of phase error in the lens pupil, be it according to a Zernike or Seidel or other defined series expansion techniques, is in all cases, when being calculated for the purposes of an image simulation calculation, made up of a sum of a finite number individual components. The invention introduces a method for determining the image profile resulting from a simulation of an aberrated lens relying upon a set of aberration sensitivity functions, which are determined through the execution of a defined set of aberration sensitivity component simulations. The aberration sensitivity functions may include may include, for example, object (reticle) variables, lens configuration variables, illumination distribution (e.g., partial coherence sigma) variables, and lens aberration variables, to name but a few. These simulations serve to determine the sensitivity of the image profile to component aberrations and act as a base sampling for adjusting a lens according to other aberration components.

From each separate component simulation set, an image profile response surface can be generated, which mathematically relates the final image profile to the value of the specified aberration component (e.g., Z2 of the Zernike Polynomial Series, as in FIGS. 3a-3k and FIGS. 4a-4k). From an input value of any one specific component, the image profile can be directly determined, without the necessity of any further execution of full simulation calculation of the imaging process (e.g., does not execute a 'propagation of image' calculation for each set of aberration coefficients). Instead, using the system and method of the invention, only execution of a quick "lookup" of the portion of the associated aberration component image profile response surface that corresponds to the input value of the given aberration is required.

An example of one form of lookup table built from the setup simulation calculations is shown in Table 2, below. That is, Table 2 shows an example of surface response function fit coefficients per simulation pixel (fit as a function of focus, for example)

TABLE 2

| Simulation pixel number | $b_0$ | $b_1$ | $b_2$ | $b_3$ | $b_4$ |
|---|---|---|---|---|---|
| 1 | $b_{0pix1}$ | $b_{1pix1}$ | $b_{2pix1}$ | $b_{3pix1}$ | $b_{4pix1}$ |
| 2 | $b_{0pix2}$ | $b_{1pix2}$ | $b_{2pix2}$ | $b_{3pix2}$ | $b_{4pix2}$ |
| 3 | $b_{0pix3}$ | $b_{1pix3}$ | $b_{2pix3}$ | $b_{3pix3}$ | $b_{4pix3}$ |
| ... | | | | | |
| 82 | $b_{0pix82}$ | $b_{1pix82}$ | $b_{2pix82}$ | $b_{3pix82}$ | $b_{4pix82}$ |
| 83 | $b_{0pix83}$ | $b_{1pix83}$ | $b_{2pix83}$ | $b_{3pix83}$ | $b_{4pix83}$ |
| 84 | $b_{0pix84}$ | $b_{1pix184}$ | $b_{2pix284}$ | $b_{3pix384}$ | $b_{4pix484}$ |

In this example, Table 2 shows 5 different coefficients ($b_0 \ldots b_4$) for each simulation pixel for the case of fitting to data generated by a simulation calculation at a single value of Zernike #2, considered exclusively. For each setup full simulation calculation executed, each simulation pixel is associated with a function representing the variation in its intensity value as a function of focus.

Table 3, below, is built from considering and fitting the contents of eleven copies of Table 2, each generated using a different value of aberration value. That is, Table 3 shows the result from fitting multiple versions of Table 2, where each version contains results from applying a different value of $A_2$ (e.g., Zernike coefficient associated with Zernike #2).

TABLE 3

| Simulation pixel number | $b_0$ | $b_1$ | $b_2$ | $b_3$ | $b_4$ |
|---|---|---|---|---|---|
| 1 | $b_{0pix1}(A_2)$ | $b_{1pix1}(A_2)$ | $b_{2pix1}(A_2)$ | $b_{3pix1}(A_2)$ | $b_{4pix1}(A_2)$ |
| 2 | $b_{0pix2}(A_2)$ | $b_{1pix2}(A_2)$ | $b_{2pix2}(A_2)$ | $b_{3pix2}(A_2)$ | $b_{4pix2}(A_2)$ |
| 3 | $b_{0pix3}(A_2)$ | $b_{1pix3}(A_2)$ | $b_{2pix3}(A_2)$ | $b_{3pix3}(A_2)$ | $b_{4pix3}(A_2)$ |
| ... | | | | | |
| 82 | $b_{0pix82}(A_2)$ | $b_{1pix82}(A_2)$ | $b_{2pix82}(A_2)$ | $b_{3pix82}(A_2)$ | $b_{4pix82}(A_2)$ |
| 83 | $b_{0pix83}(A_2)$ | $b_{1pix83}(A_2)$ | $b_{2pix83}(A_2)$ | $b_{3pix83}(A_2)$ | $b_{4pix83}(A_2)$ |
| 84 | $b_{0pix84}(A_2)$ | $b_{1pix184}(A_2)$ | $b_{2pix284}(A_2)$ | $b_{3pix384}(A_2)$ | $b_{4pix484}(A_2)$ |

In Table 3, each $b_n$(per pixel) is fit as a function of aberration value variation. Thus the resulting $b_n(A_2)$ is immediately known once a value of $A_2$ is supplied. Knowing all $b_n$ allows the reconstruction of the intensity or amplitude vs. focus curve associated with the given simulation pixel. Such fitting of through-focus data is performed for each simulation pixel, and likewise each simulation pixel contributes a through-focus response curve to the overall image profile curves and data.

It should be well understood that the values of Tables 2 and 3 are provided for illustrative purposes, and are not to be considered limiting features for the purposes of the invention. Additionally, Table 3 can be built using any number of copies of Table 2, depending on the particular application.

Now, using the system and method of the invention, one such image profile response surface representation is created for each defined aberration component. When it is desired to evaluate the image profile resulting from any user-input combination of aberration components, it is only necessary to appropriately combine the results from each of the various aberration components. In implementation, the sum of aberration coefficients may be in the form of a simple linear sum of all components, or it may include additional terms corresponding to weighted cross-terms (Equation 5) (products) of various aberration component series coefficients.

The fact that an accurate estimate of an image profile can be realized via a simple "lookup" action or direct evaluation of a simple function on an existing response surface is an advantage to the invention over the existing standard practice. This significantly reduces the calculation task when desiring to estimate the image profile in the presence of an arbitrary set of aberration components (as represented by an arbitrary set of Zernike coefficients, for example). Thus, by using the system and method of the invention, only a set of look-up executions or direct evaluations of simple functions, followed by a combining and summing of these aberration components' respective image profile contributions, are required to estimate the final image profile. The advantage of the invention is fully realized, for example, when facing the task of calculating many hundreds or thousands of sets of aberration components, and can be appreciated to the fullest extent when each calculation of a single defined "set" of aberration components (e.g., 37 Zernike coefficients representing each of 30-40 positions within a defined exposure field area) is used as input into a subsequent calculation whose output is still another new set of aberration components, which in turn are to be re-evaluated for the resulting image profile in their presence.

Discussion of FIGS. 1a Through 4k

Now understanding the above, FIGS. 1a-4k graphically show sets of data sample points representing a response surface. These data points may be generated in the manner described below with reference to equations (6) and (8), for example, using coefficients corresponding to aberration value components. By the system and method of the invention, the data points of FIGS. 1a-4k are translated into a look-up table for streamlining known simulation techniques using these or other lens aberration components or a combination thereof. The lookup table may contain full simulation calculation results, that are stored and used interpolation calculations, or it may contain coefficients resulting from the fitting of specific functional forms to the full simulation calculation results, as shown in the example of Table 2. This is accomplished, in implementation, by setting up a look up table with these extensive data points and, in implementation, using interpolative methods (linear equations) to determine image profiles with a combination of the same or different aberration components.

In one implementation, the sampling data may include, for example:
(i) between 11 and 17 focus levels (e.g., −500 nm to +500 nm);
(ii) between 5 and 17 aberration levels (e.g., −0.050 m$\lambda$ coefficient value to +0.050 m$\lambda$);
(iii) approximately 37 linear aberration components (e.g., the Fringe Zernike Polynomial); and
(iv) 0 to 10 non linear aberration components.

The data points of FIGS. 1a and 1b, for example, or any other data points calculated as the initial set up, may be provided in a look up table as provided in the illustrative table below. The image profile intensity (i.e., intensity vs. position) is shown by each individual line of FIG. 1a. By providing any other aberration components, combination of aberration components or the like, a simple look up and interpolative calculation can now be performed in order to determine the image profile using such new combination of aberration components. Also, for purposes of optimization, the system and method can use these data points as feedback into a lens adjustment optimization calculation loop, for the purpose of adjusting any lens towards a target of optimized image profile. The representative table may be used to build the response surface function relations, as graphically depicted in FIGS. 1a through 4k, and specifically detailed according to one implementation in Table 2 and Table 3.

FIG. 1b represents the through focus intensity profile associated with various simulation pixel positions in the image plane of FIG. 1a However, in FIG. 1b, the data points are graphically represented as aerial image intensity vs. horizontal position grouped by defocus level. More specifically, FIG. 1b shows the consideration of each horizontal position, itself, and how the value of intensity changes as a function change of focus. The horizontal position is measured in nanometers, with approximately 83 measured positions in the example shown.

As shown, the light intensity is along the vertical axis, with a perfect shadow image going to "0" from some arbitrary unit of amplitude or intensity, as delivered from the setup full image simulation calculations. As should be understood from this graphically representation, more shadow is represented by lower values along the vertical axis. In contrast, higher values are representative of greater light. Thus, as should be understood, a different shadow pattern or image profile will result at each different focus, where the focus range of the graphs represent from −0.25 to +0.25 micron of focus change.

However, as in FIG. 1a, it should be understood that each line is actually a set of data points, which when connected to one another form the line. This is shown to visualize the linear nature of the data obtained from the calculated lens aberration components over a wide range of data points. Due to the linear nature of the obtained data points, through known calculations, the interpolation process of the invention is possible. That is, by using the method and system of the invention, a new set of aberration components may be used to determine an image profile by the interpolation of the already computed data points (representative of aberration components). The interpolated data may be represented by a connection between the already existing data points.

FIG. 2 is a three dimensional representation of the data points of FIGS. 1a and 1b. In FIG. 2, representative of the series contained in FIG. 1a would be the surface plot as viewed from the angle corresponding to the horizontal position axis. Also, the surface plot of FIG. 2 as viewed from the angle corresponding to the focus axis, would be representative of the series as contained in FIG. 1a. Thus, this graphical representation shows, visually, how intensity changes within the surface of the graph. Again, this graphical representation further shows that the surface features behave smoothly over a large data set of aberration components, thus allowing for very accurate interpolation of the data with minimal required fit coefficients, in the case of this example. This, in turn, provides for very accurate calculations using other aberration components.

FIGS. 3a through 3k show three dimensional surfaces for several Zernike#2 values, depicted in the same format as FIG. 2. That is, the surface plots of FIGS. 3a through 3k are representative of the variation in the image profile when Zernike #2 is varied over a range of −0.025 to 0.025 waves rms (root mean square) wave front error. It is clear that the changes in the image profile are smoothly varying between the various aberration values used in executing the setup simulations. This allows the development and fitting of functional response surface descriptions of this variation in image profile as a function of aberration coefficient value. Again, by using these simulation "setup" results, it is possible to simulate known patterns with different aberration components, using the system and method of the invention.

Also, as should now be understood by those of ordinary skill, the different values of aberration components will provide different changes in the image profile. And each different specific aberration component may yield its own shape of change to the image profile. This possibility is accounted for by executing the Aberration Sensitivity setup simulations for each potentially impacting aberration (e.g., Zernike) term and combinations of terms (e.g., cross-terms).

Figure 3A:
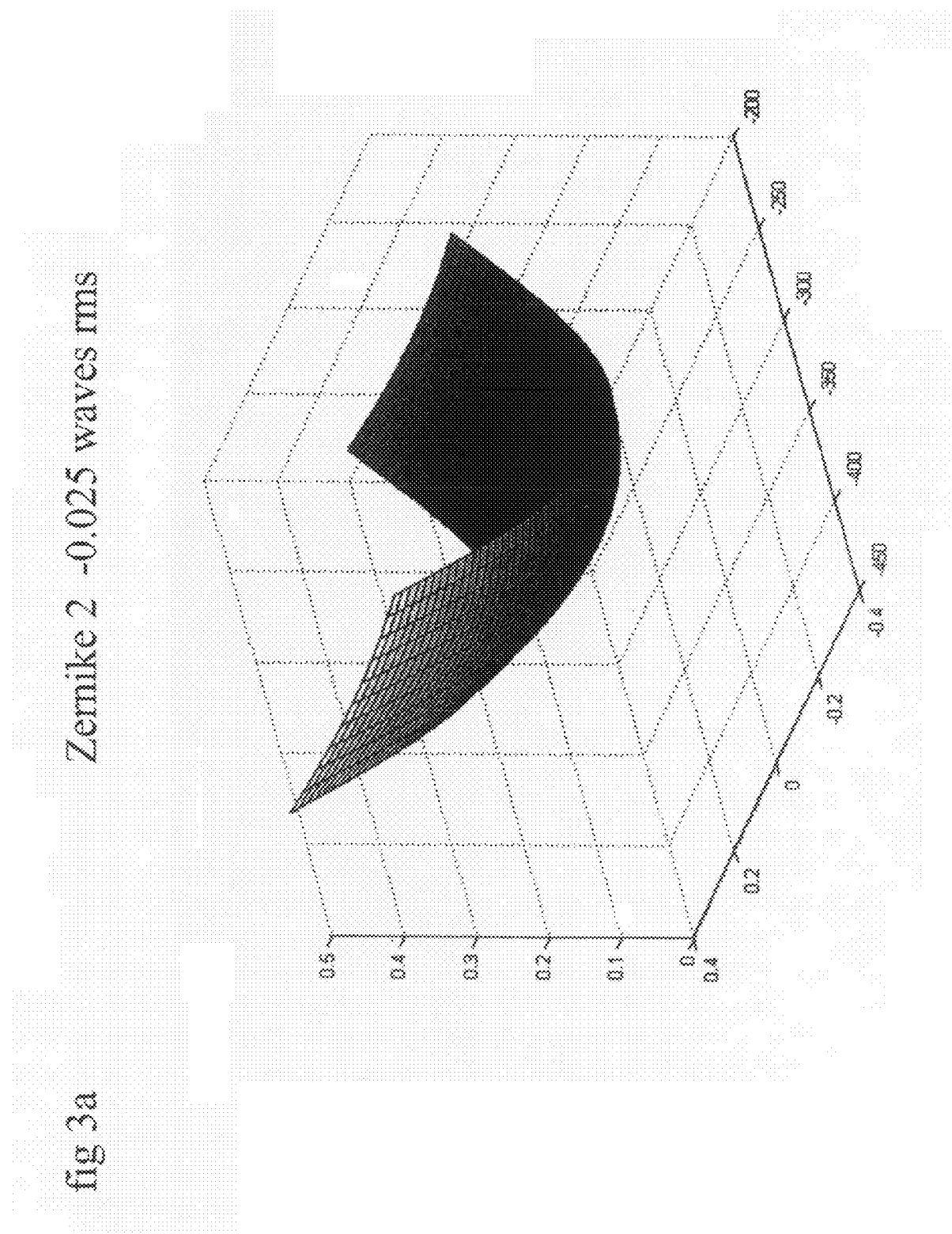
FIG. 3a-3k graphically shows a series of image profile surface plots, each resulting from a full simulation calculation using a different entered value of Zernike #2, representing a response surface generated in accordance with the invention.
Figure 3B:
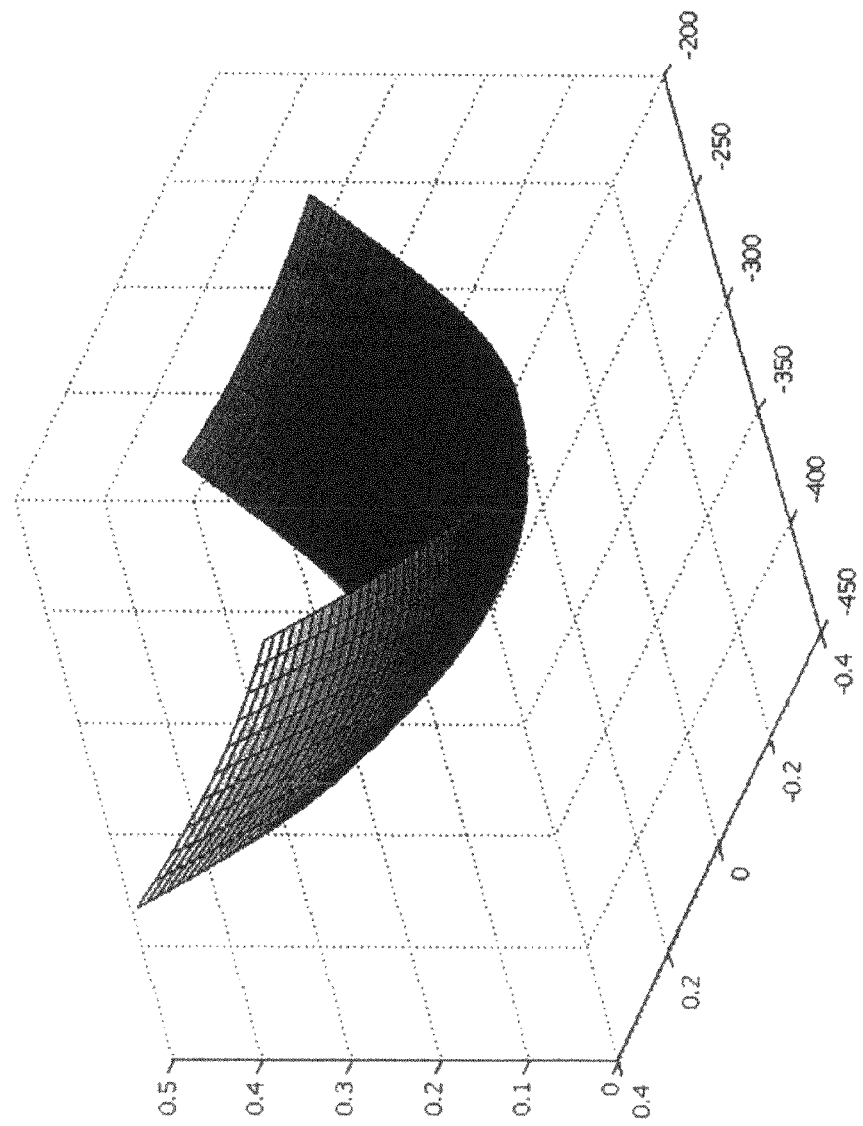
Figure 3C:
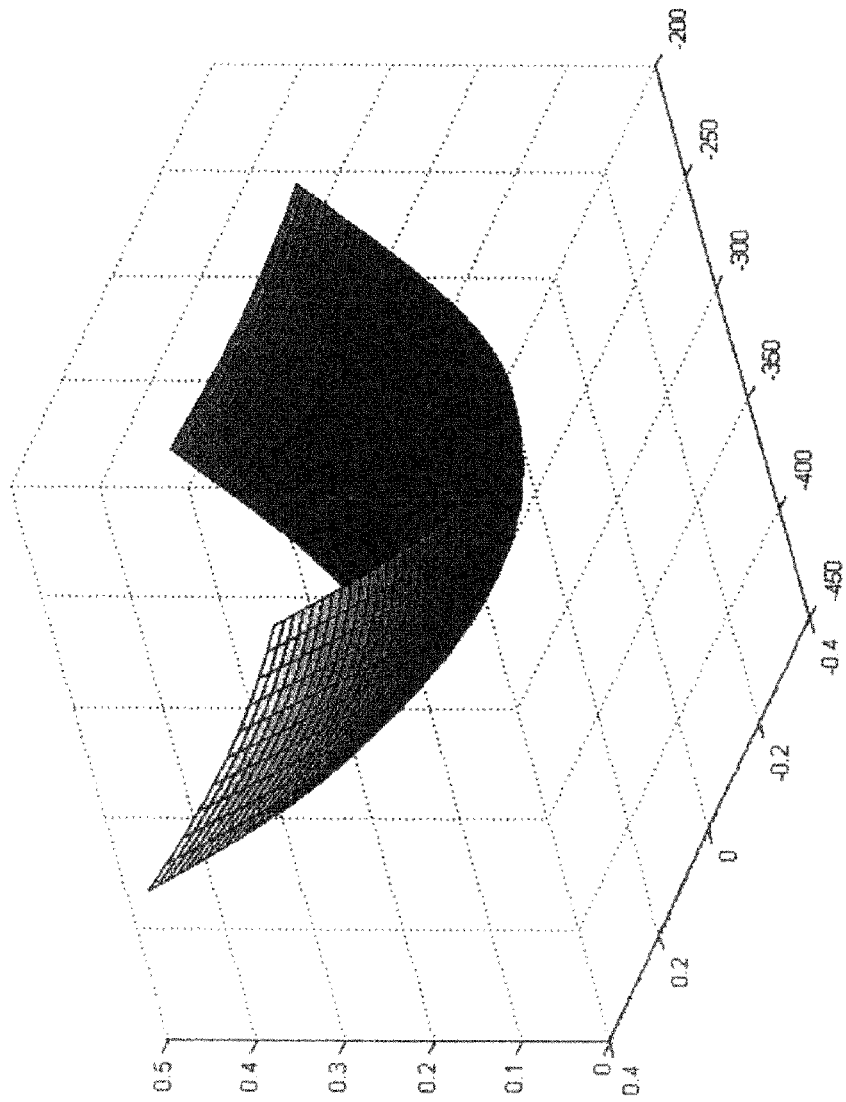
Figure 3D:
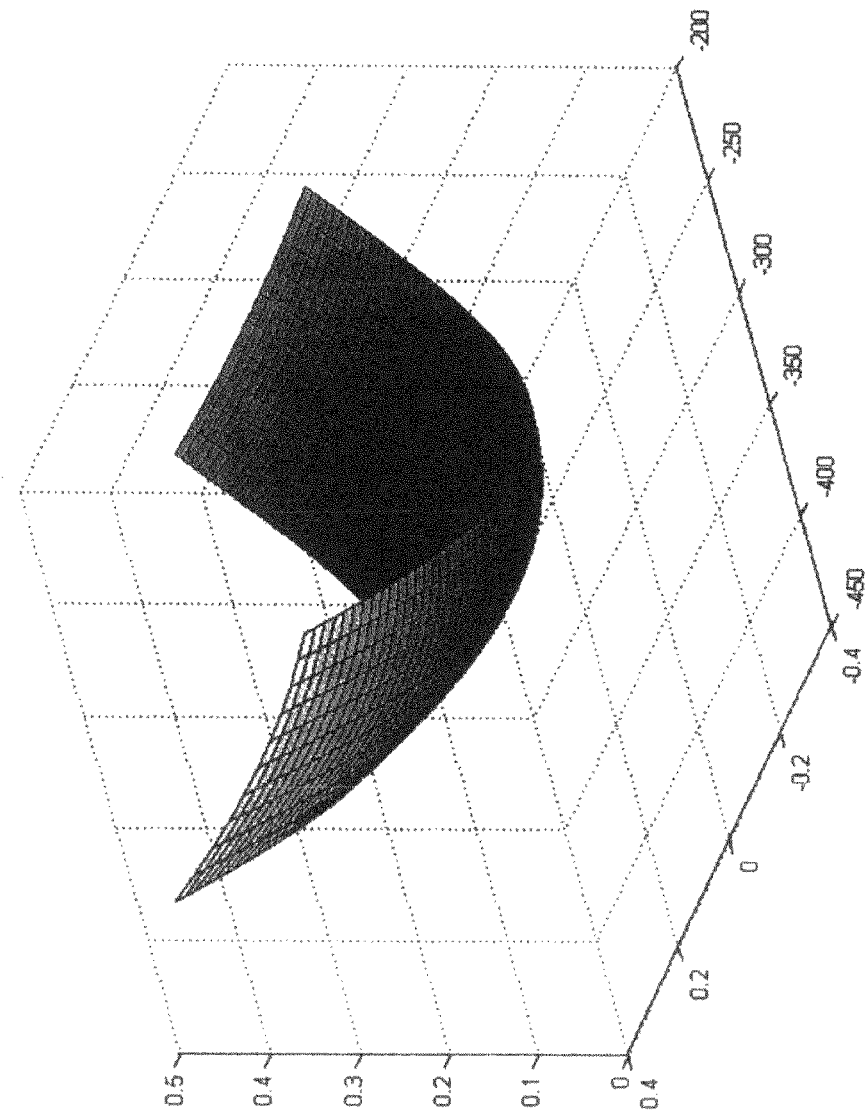
Figure 3E:
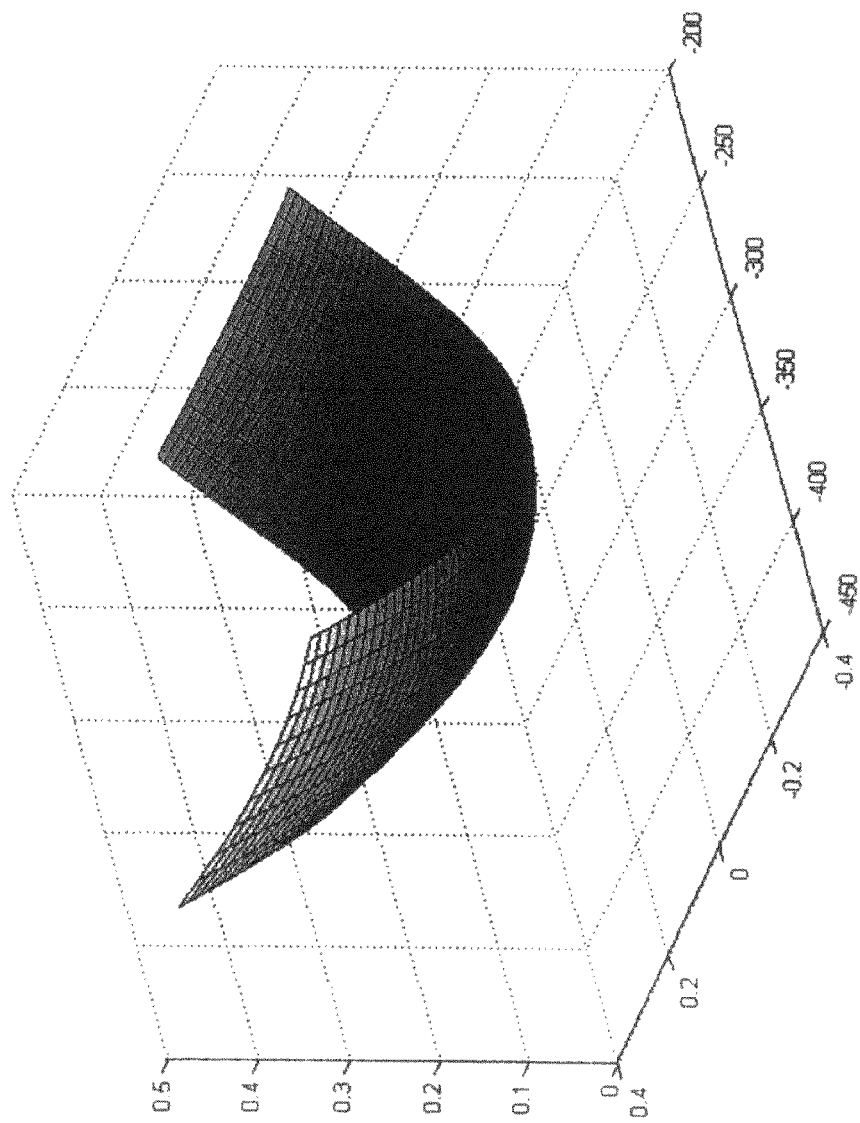
Figure 3F:
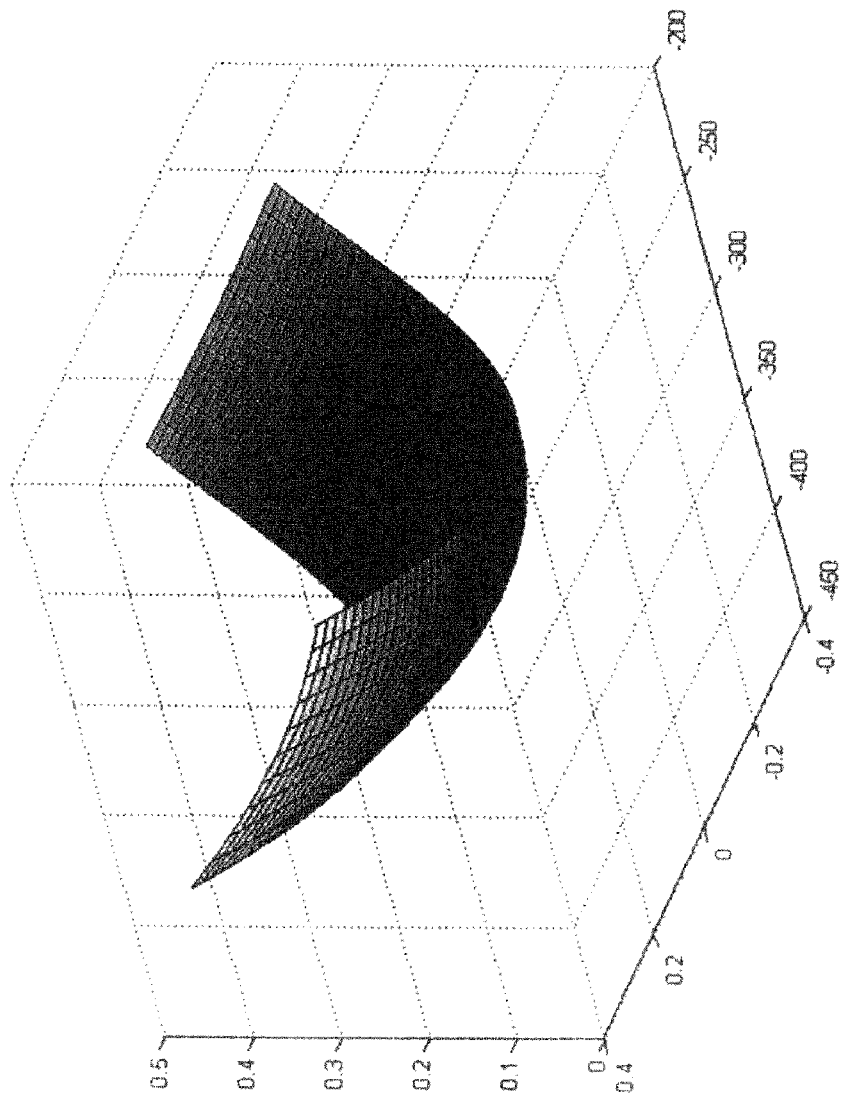
Figure 3G:
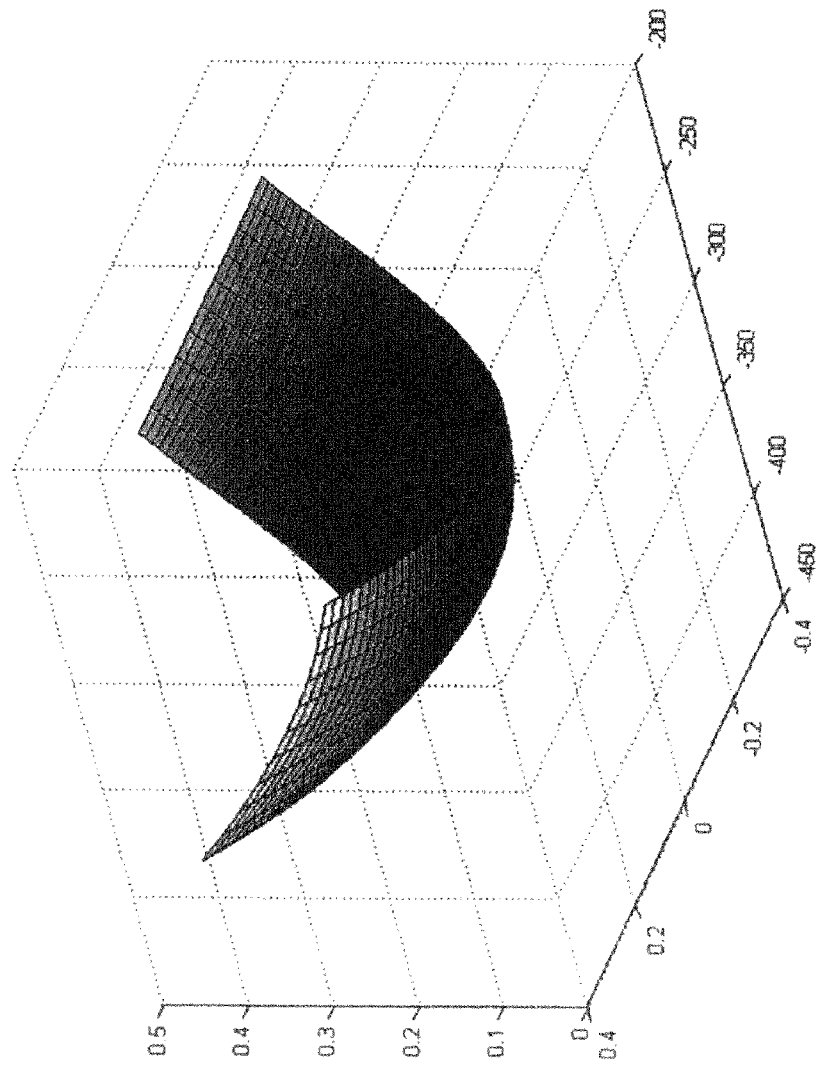
Figure 3H:
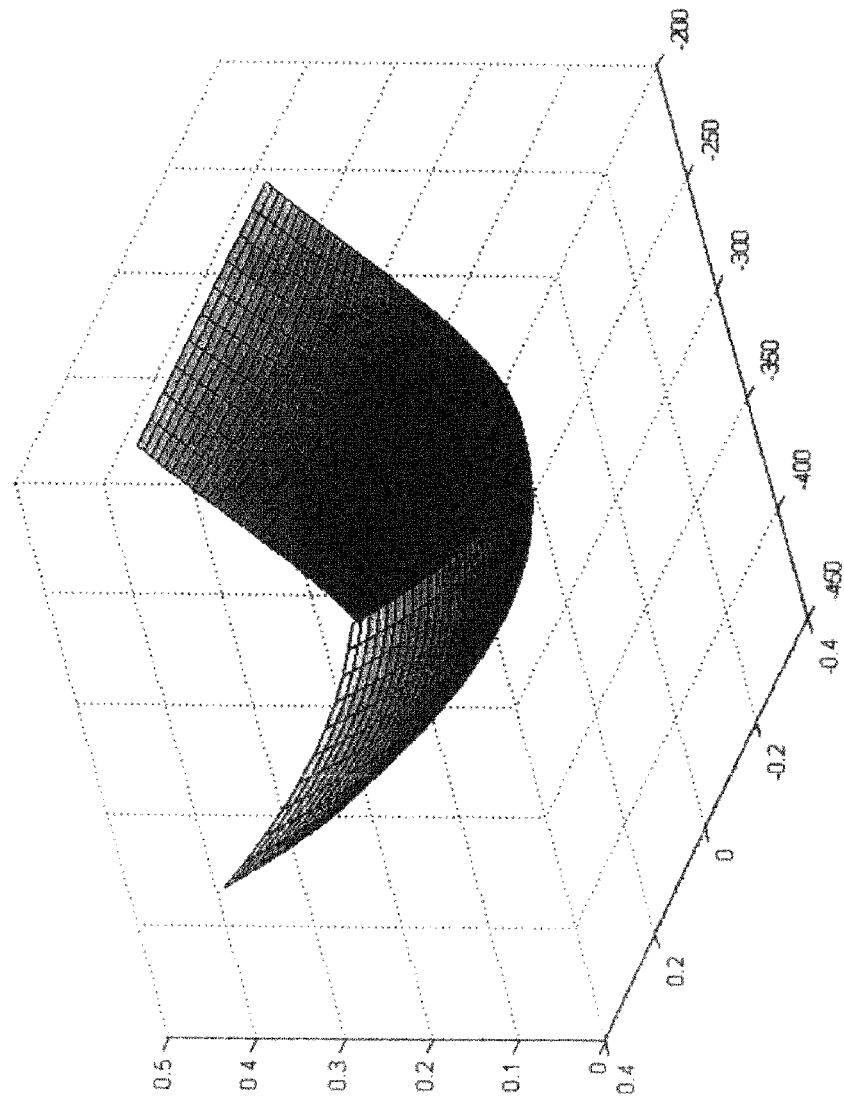
Figure 3I:
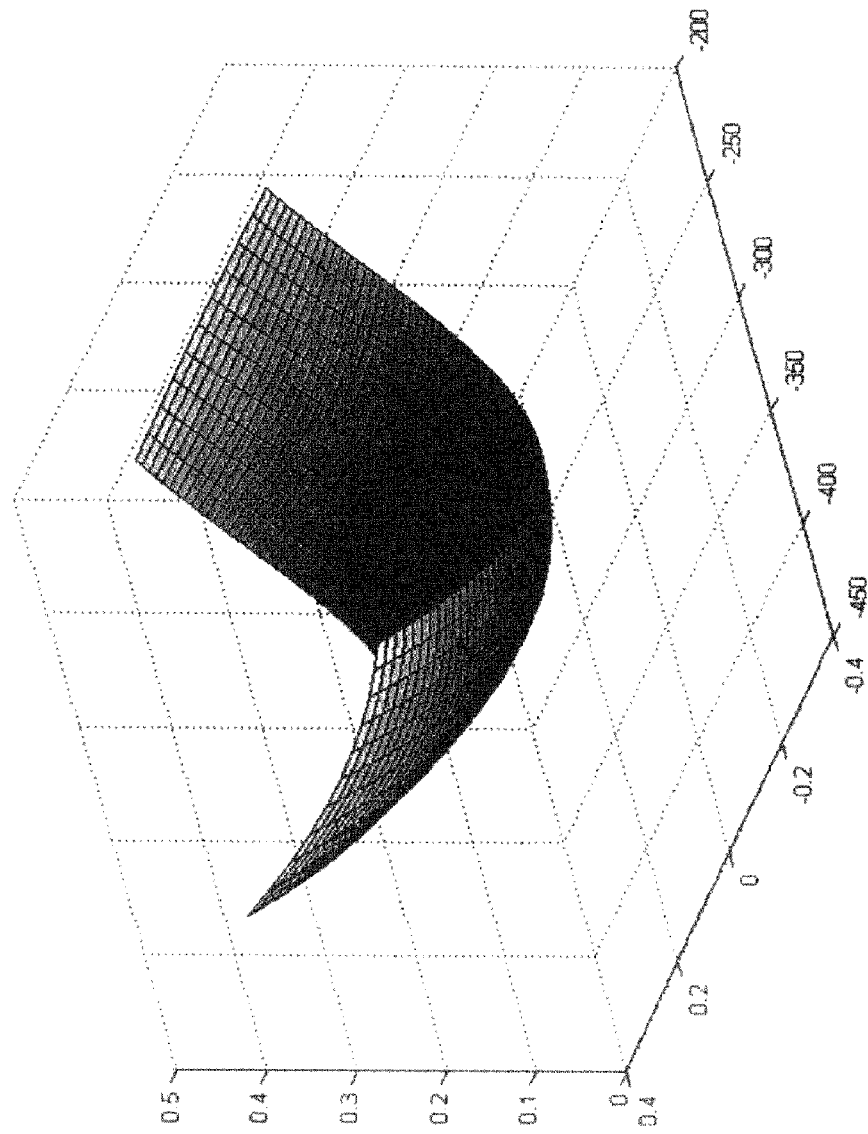
Figure 3J:
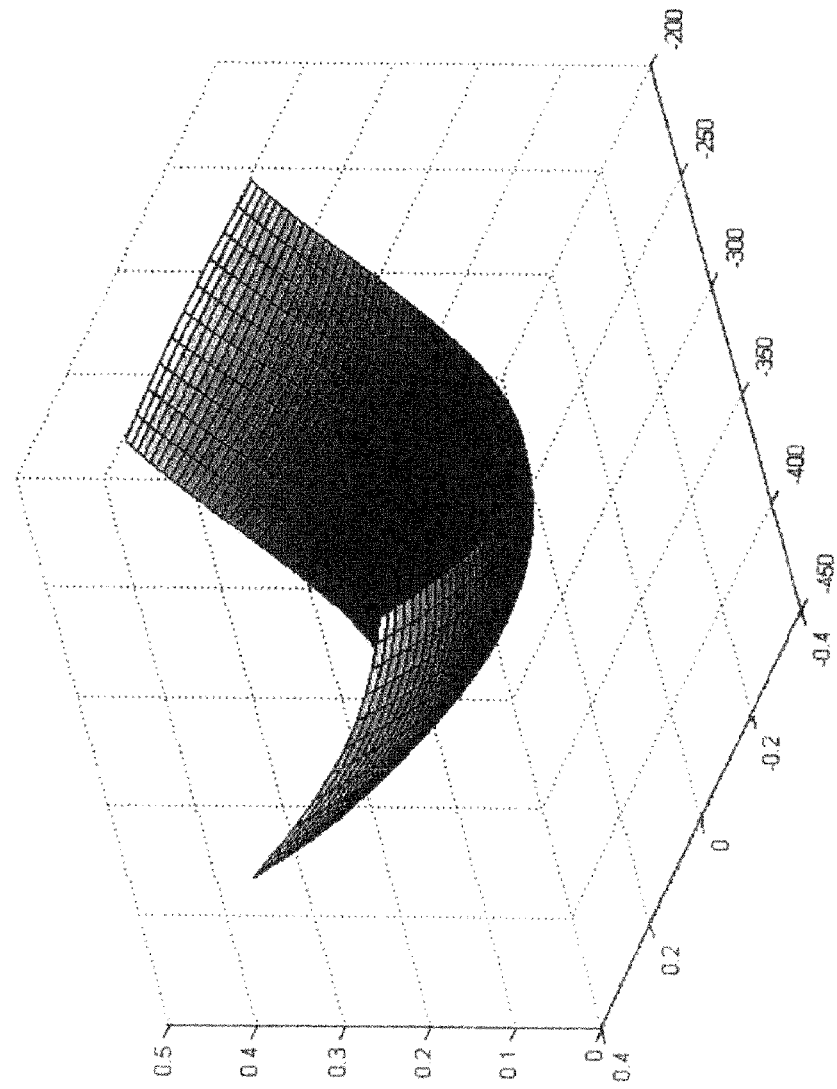
Figure 3K:
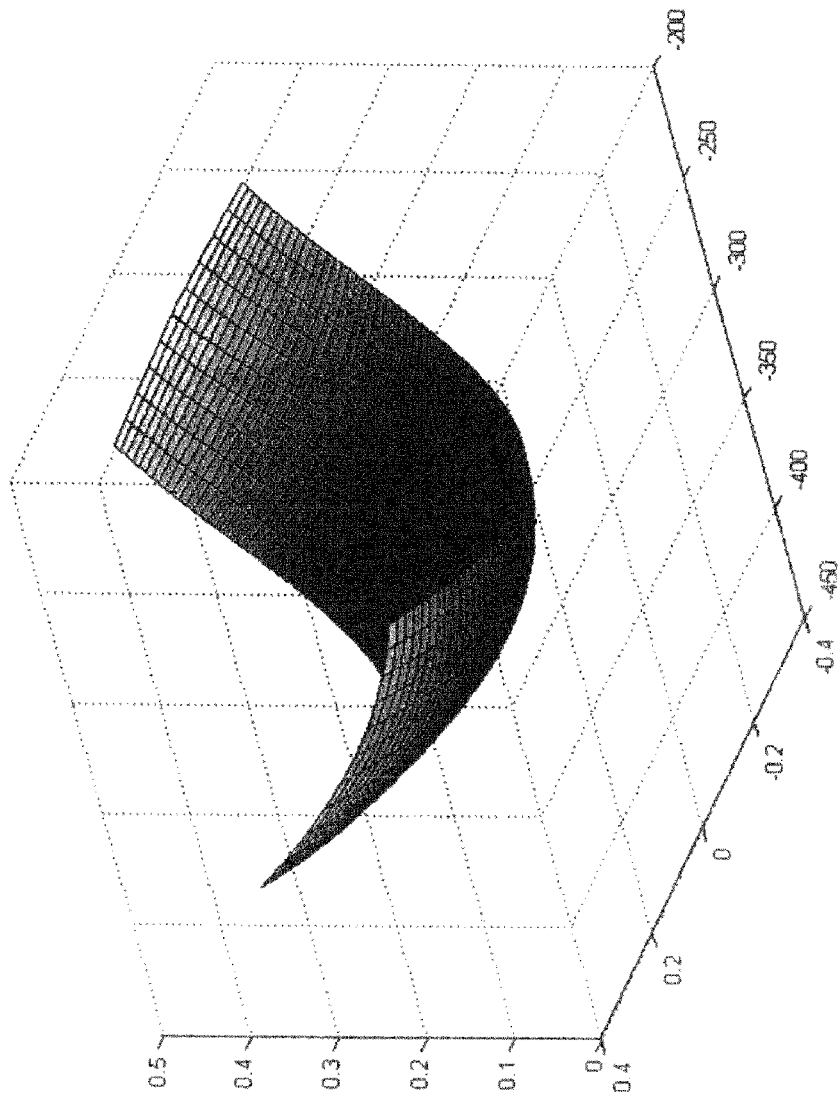
Figure 4A:
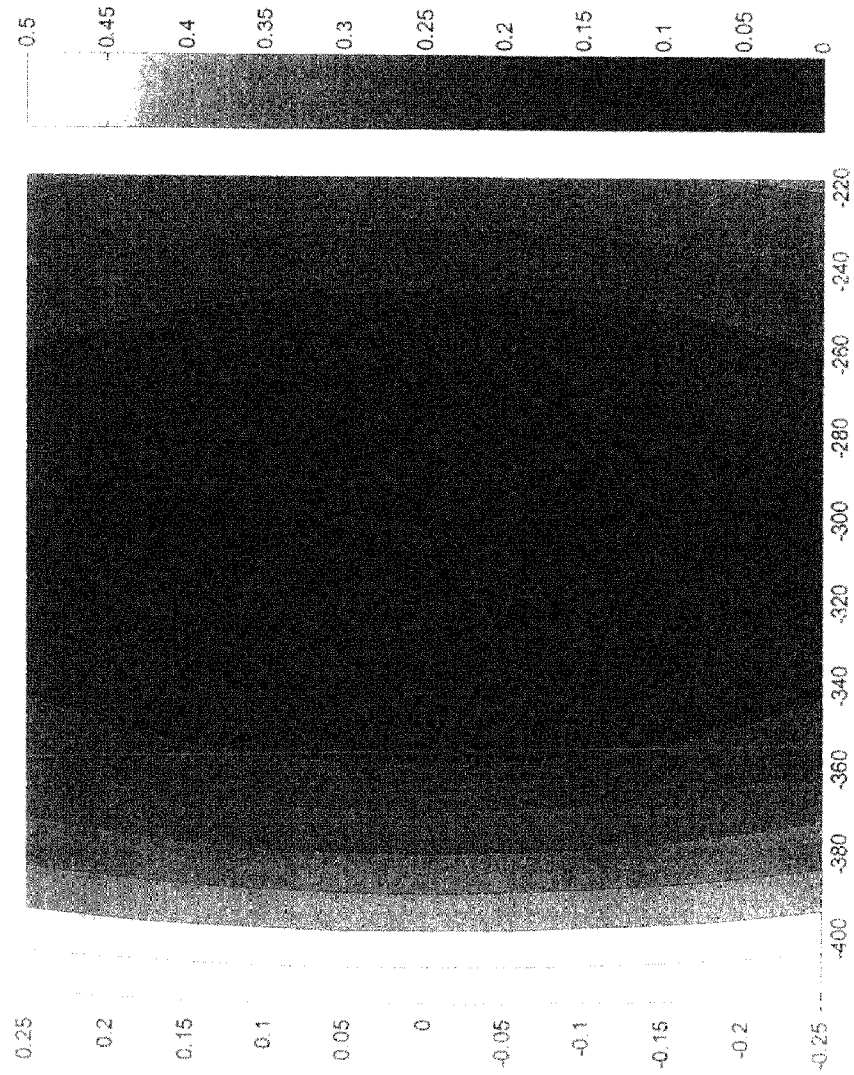
FIGS. 4a-4k graphically show the same data as represented in FIGS. 3a-3k, in the form of a contour plot, representing a response surface generated in accordance with the invention.
Figure 4B:
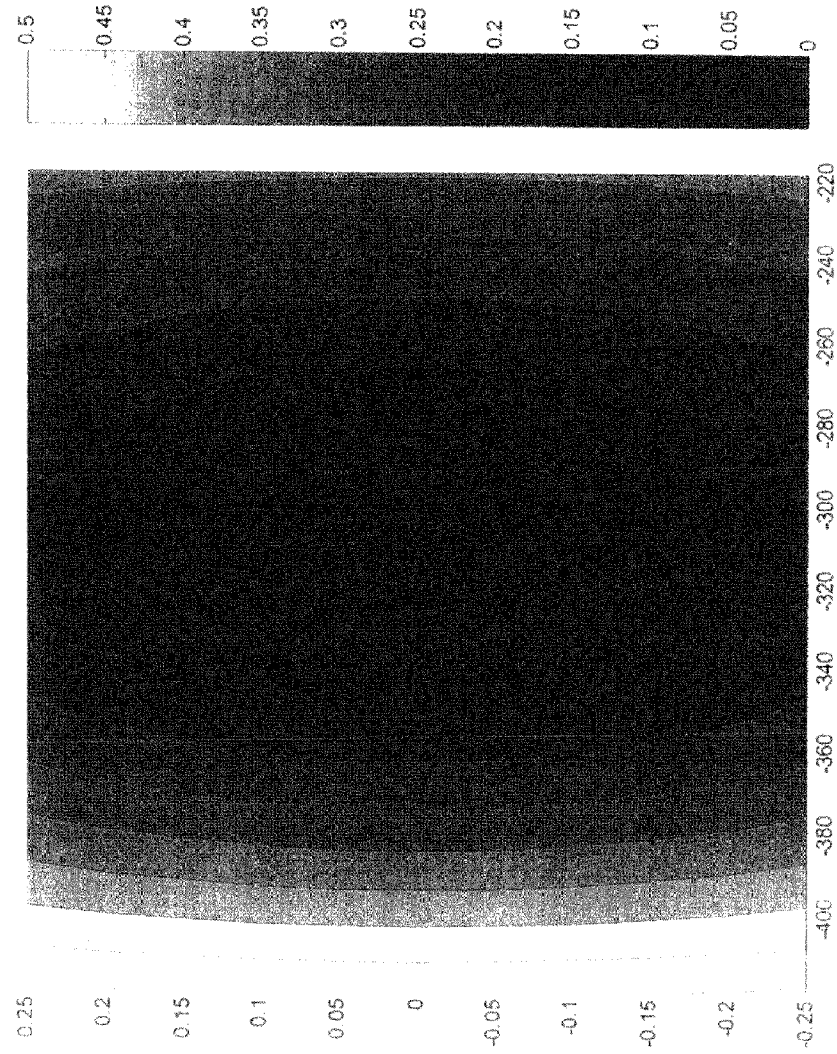
Figure 4C:
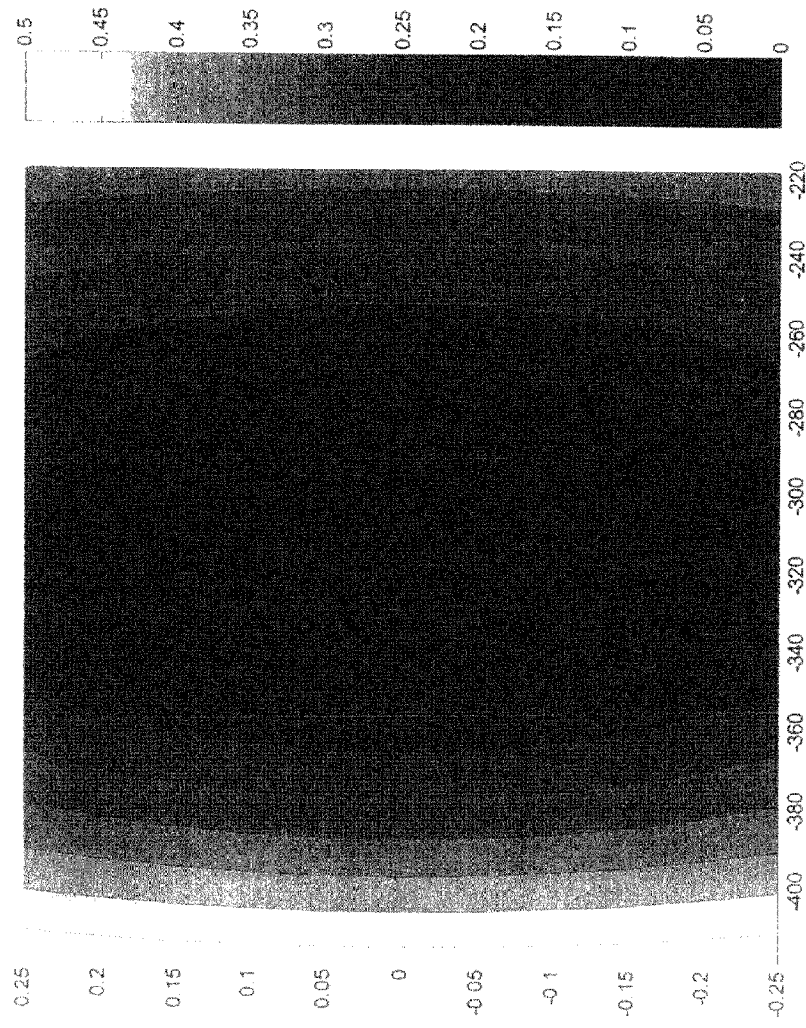
Figure 4D:
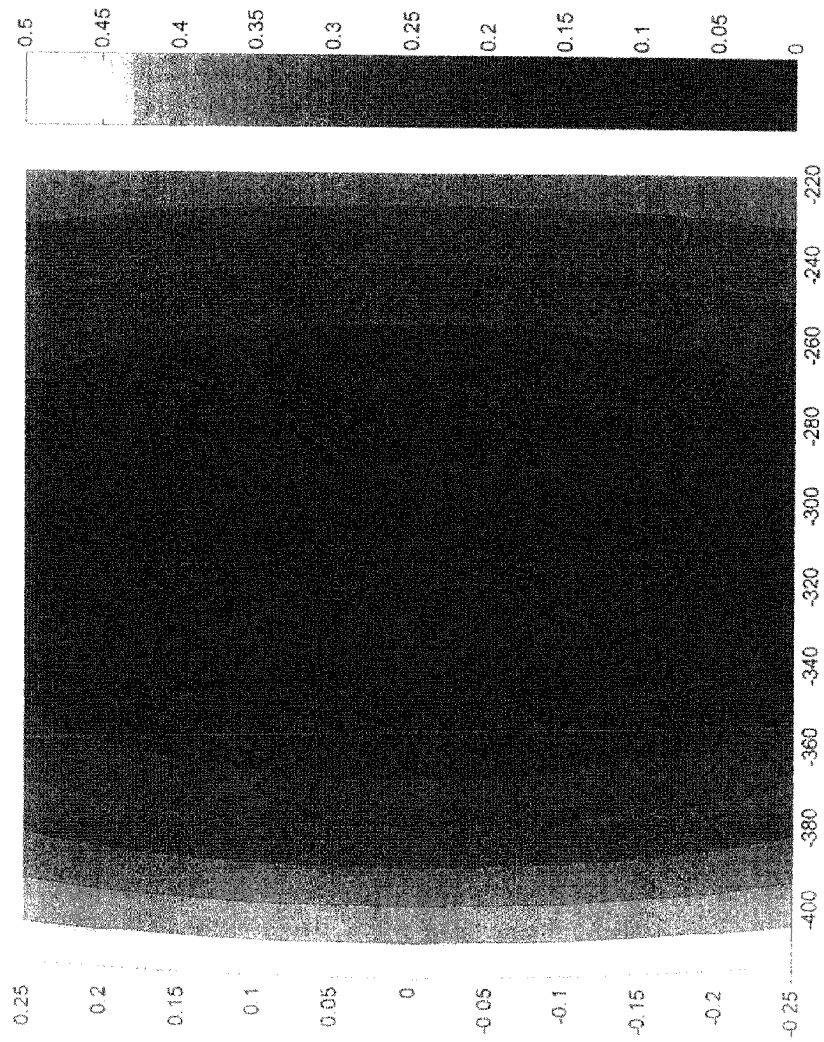
Figure 4E:
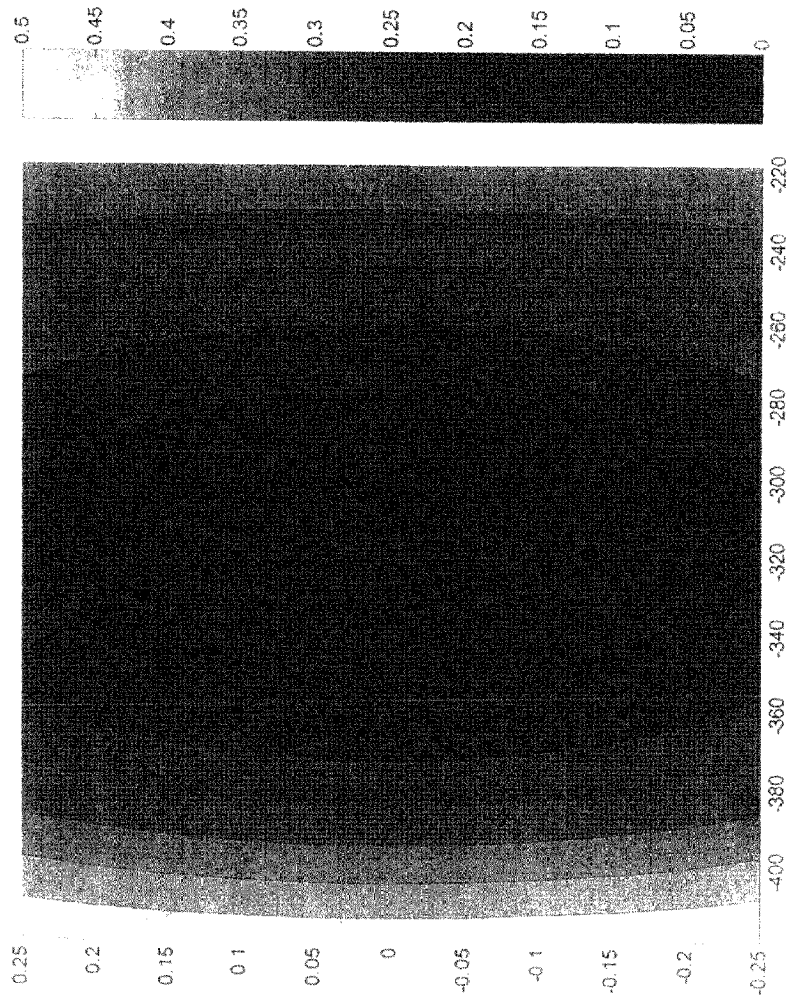
Figure 4F:
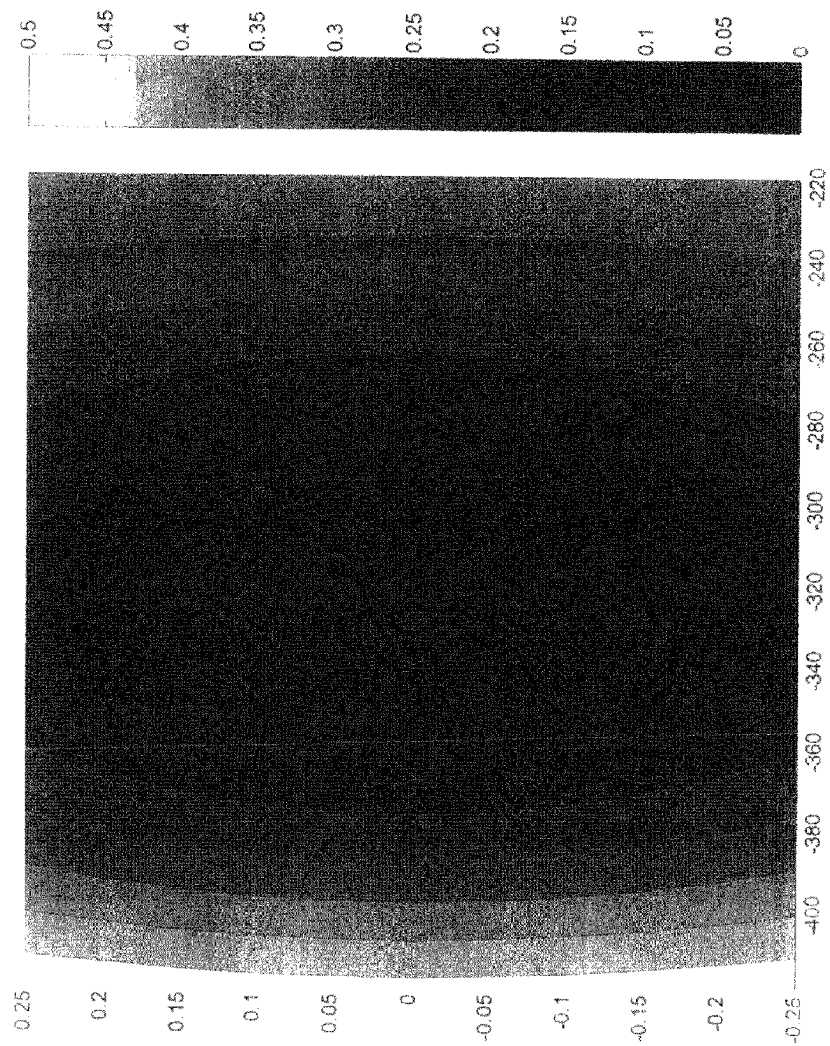
Figure 4G:
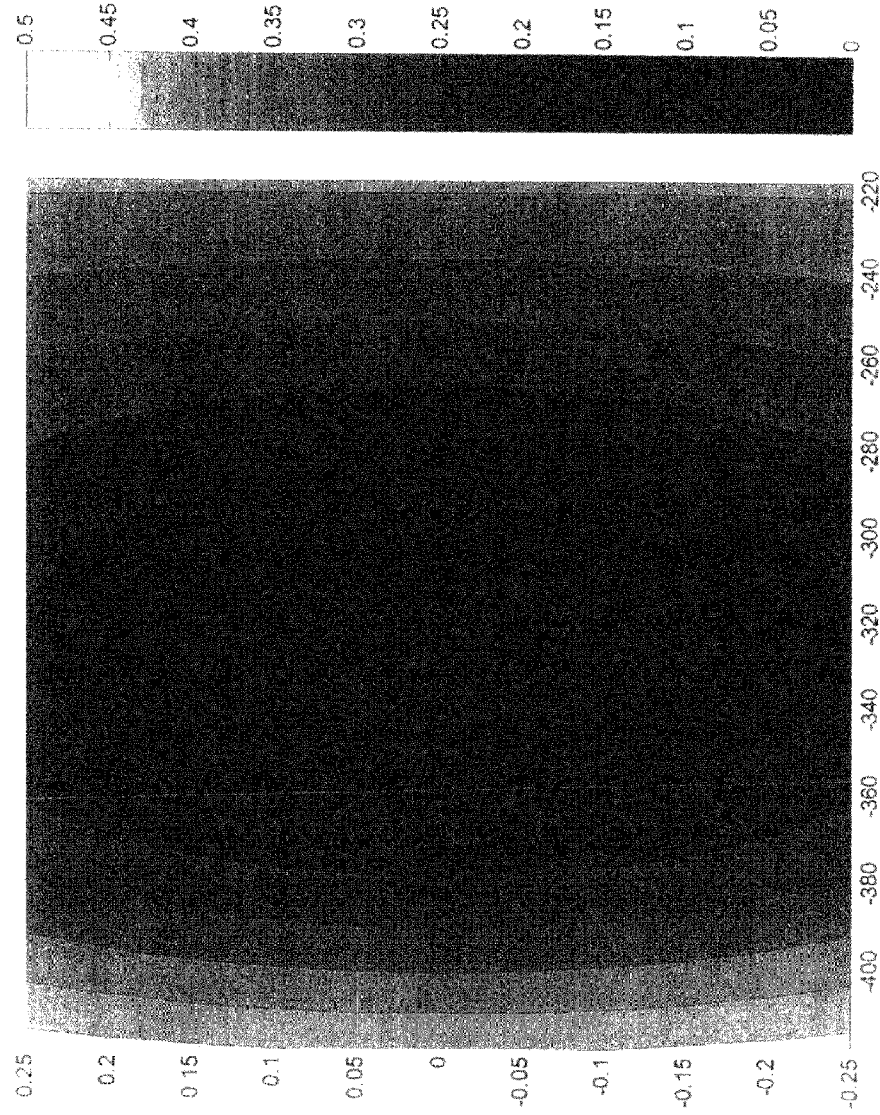
Figure 4H:
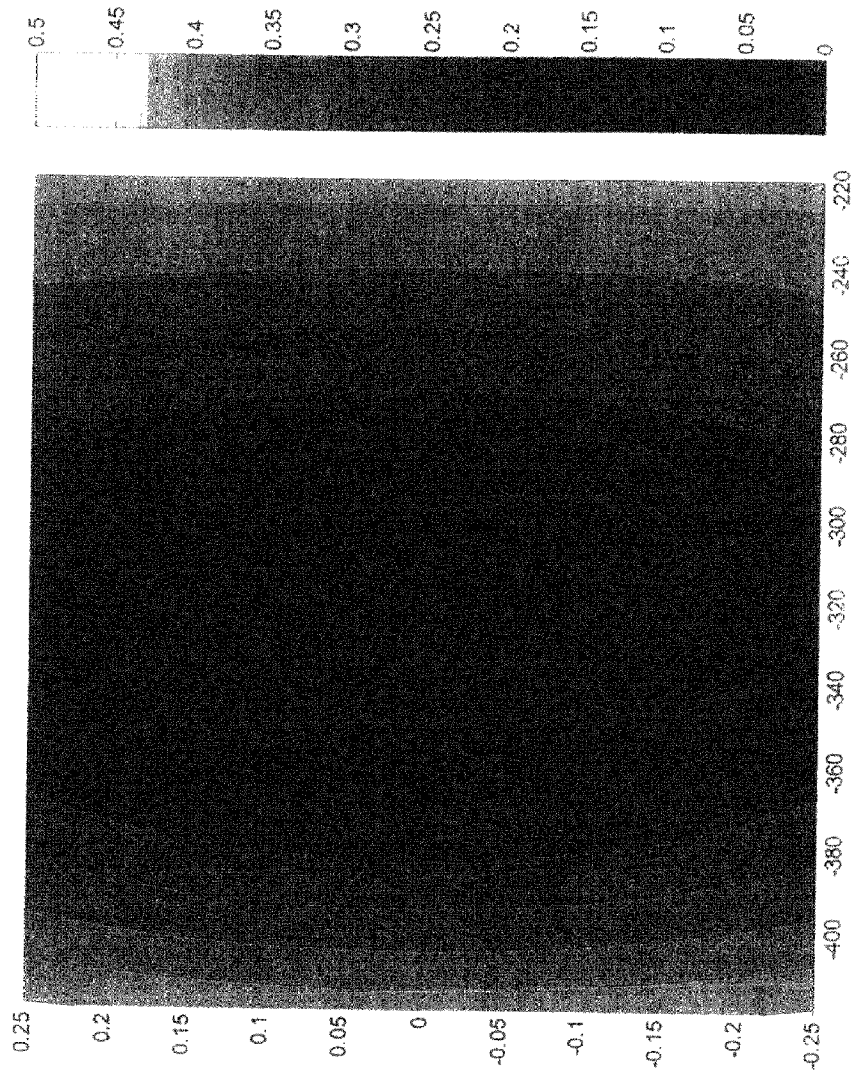
Figure 4I:
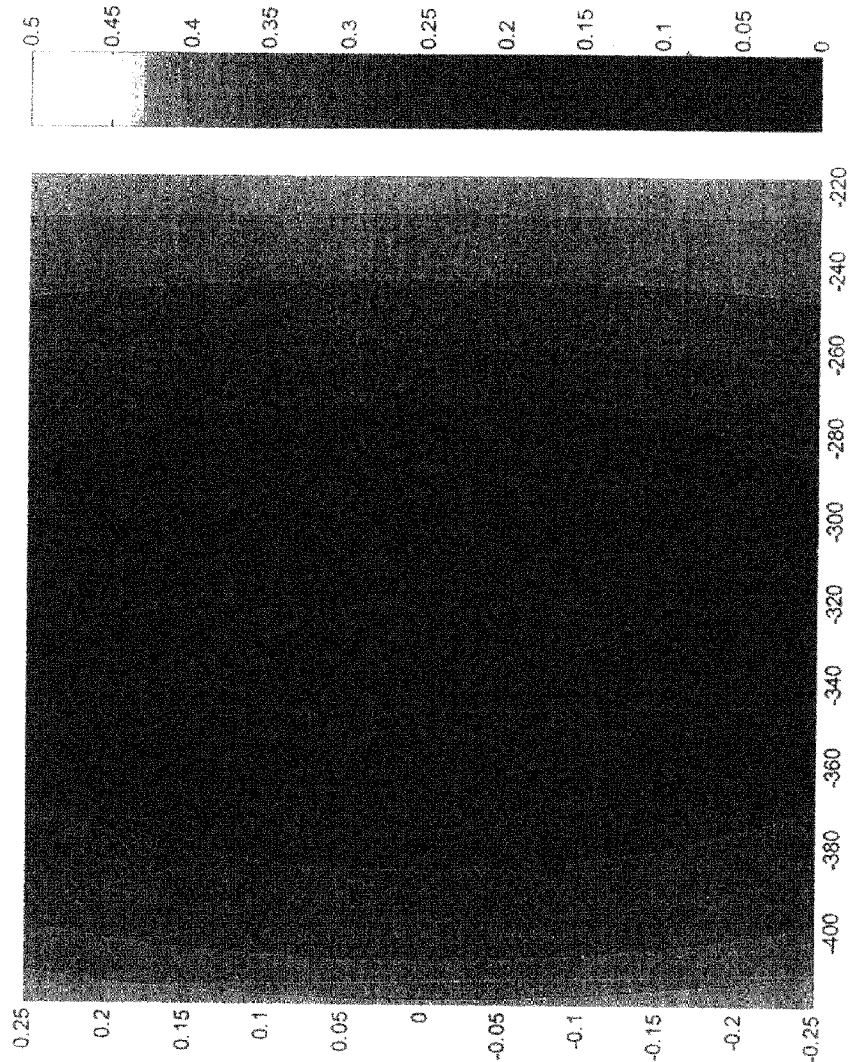
Figure 4J:
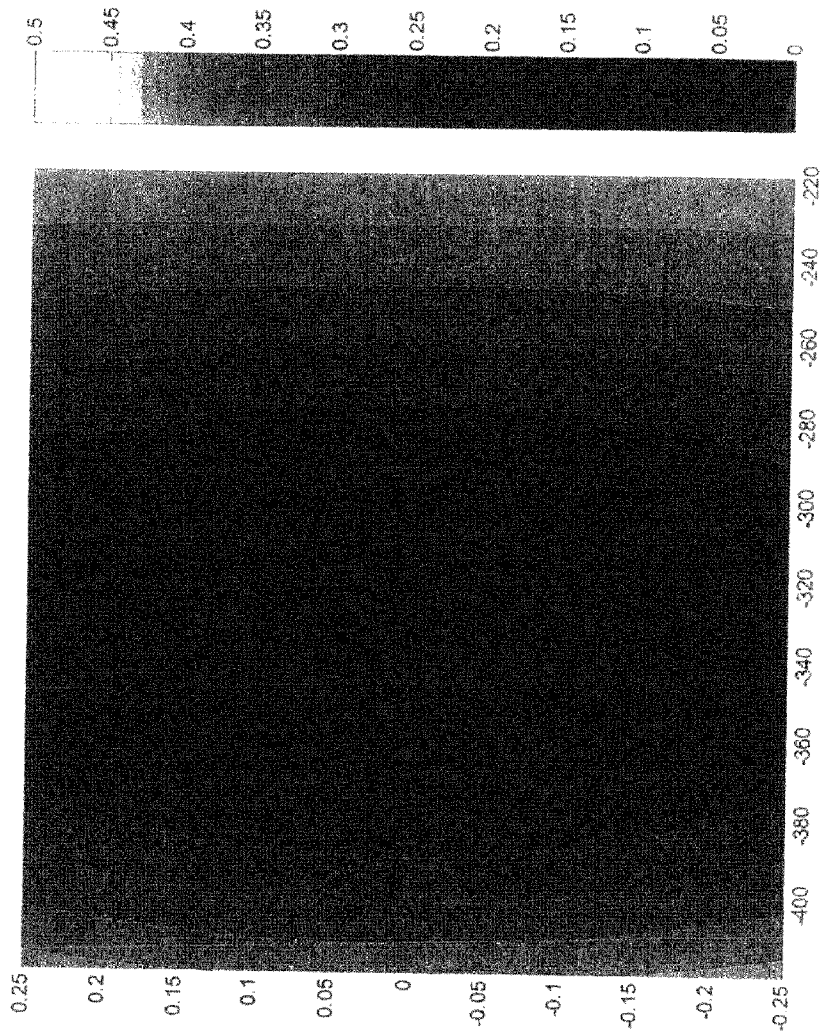
Figure 4K:
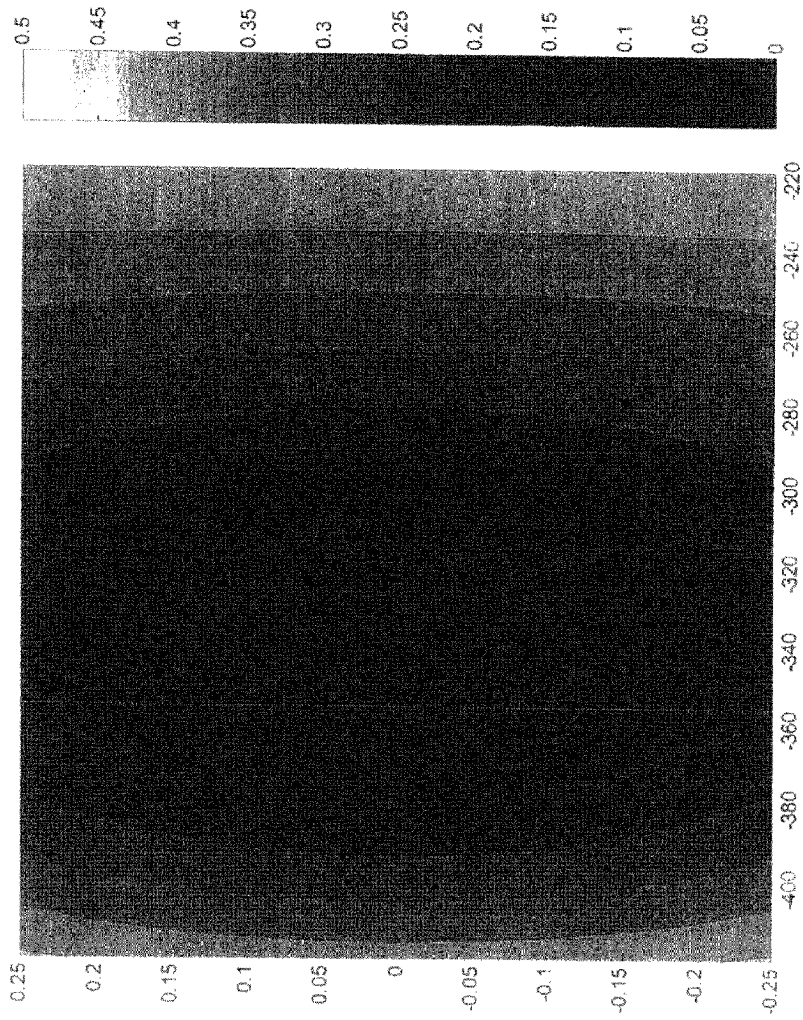

Referring to FIG. 3e, for example, the graph is representative of aerial image intensity or amplitude as a function of horizontal pixel position (assuming a vertically oriented pattern of study) and focus for one single specified aberration component set of values. In the case shown in FIG. 3e, all aberration values are set equal to zero. The values representing aerial image intensity are a set of arbitrary units ranging from approximately 0.00 to approximately 1.0, with a focus variation of between −0.25 to 0.25 (micron, corresponding to −250 nm to +250 nm). This graph may be representative of a component(s) of response surface function relations, which are built by the system and method of the invention during a setup phase prior to a user specifying initial aberration values representing a given lens. It is the response surface functional relations which are used in subsequent, less computationally intensive calculations, to determine image profiles using the user provided set of aberration values for a given lens.

The contour plots of FIGS. 4a through 4k correspond to different views of the same data as are contained in FIGS. 3a through 3k, respectively. That is, FIGS. 4a through 4k show the results for varying the value of Zernike #2 from −0.025 to 0.025, respectively, along intensity vs. focus vs. horizontal position. The plots of FIGS. 4a-4k can be viewed as a top-down view of the respective plots of FIG. 3a-3k.

Illustrative Data Points Used for Aberration Correction

In one implementation of the invention, to build the response surface functional relations, a "simulation pixel" is defined as the unit of horizontal position into which aerial image is divided. In a representative example, a section of about 2.14 nm for the simulation pixel is used to obtain the desired accuracy. Next, the aerial image intensity is calculated on each simulation pixel with 11 steps of defocus (from −250 nm to 250 nm, 50 nm pitch). Then, $4^{th}$ order fitting functions expressed as the following equation (5) are applied, and the coefficients $b_0 \ldots b_4$ are stored for each simulation pixel, now representing the variation of image intensity as a function of focus level for a given value of aberration level and at the pixel position being considered.

$$I_{spx}(x) = b_0 + b_1 x + b_2 x^2 + b_3 x^3 + b_4 x^4 \quad (5)$$

where $I_{spx}$ indicates aerial image intensity at a simulation pixel (spx); and x indicates defocus.

If the data being fit shows more rapid variation than the example shown, then higher order fitting function may be necessary in order to provide more accurate results. In this case, equation (5) may be represented more generally as:

$$I_{spx}(x) = b_0 + b_1 x + b_2 x^2 + b_3 x^3 + \ldots + b_n x^n \quad (6)$$

Further, alternative methods and basis functions may be applied in the fitting of intensity response to focus change. For example, sinusoidal functions, such result from Fourier Transform operations (e.g., Fourier Transformation or Fast Fourier Transform algorithm intended to estimate the Fourier Transformation process), are also acceptable. Following the determination of the coefficients of fit of the data, the image intensity or amplitude at arbitrary defocus positions can now be obtained. By using the coefficients $b_0 \ldots b_4$, it is possible to build the response surface functional relations of the invention using a construct as represented in equation (7), below.

In one example of interpolation to yield a response surface for a variation of aberration value, each of the coefficients $b_0 \ldots b_4$, can be themselves plotted as a function of aberration coefficient value. Then, for any entered value of aberration coefficient value, a similar Image Profile Surface Plot of intensity or amplitude versus Focus is fully determined, as further described below.

To extend this description to include consideration of more than a single aberration coefficient, aerial image intensity is calculated on each simulation pixel with each of the coefficients of 36 Zernike terms (from $Z_2$ to $Z_{37}$) varied through 11 steps of the coefficient value (from −25 ml to 25 ml, 5 ml pitch). The calculations are examined at each of the defocus positions treated. The change of the coefficients $b_0 \ldots b_4$ of the equation (4) is described by the $4^{th}$ order fitting function expressed as equation (6).

$$b_{i(with\_aberration)} = b_{i(w/o\_aberration)} + \sum_{j=2}^{37} \Delta b_i(cj) \quad (7)$$

$$= b_{i(w/o\_aberration)} + \sum_{j=2}^{37} \varphi_{0(i,j)} + \varphi_{1(i,j)} c_j +$$

$$\varphi_{2(i,j)} c_j^2 + \varphi_{3(i,j)} c_j^3 + \varphi_{4(i,j)} c_j^4$$

In equation (7), $b_{i(with\ aberration)}$ and $b_{i(w/o\ aberration)}$ represents the coefficients $b_0 \ldots b_4$ influenced by lens aberrations and the coefficients $b_0 \ldots b_4$ without aberrations, respectively. $\Delta bi$ indicates the change in coefficients and it is expressed by the $4^{th}$ order fitting function of jth Zernike coefficient $c_j$. The $\varnothing_{0(ij)} \ldots \varnothing_{4(ij)}$ are the coefficients of the fitting function. Total changes of the coefficients $b_i$ are expressed as the summation of $\Delta b_i(c_j)$ from $Z_2$ to $Z_{37}$.

It should be recognized, though, that $\Delta bi$ can indicate the change in coefficients expressed by the $n^{th}$ order fitting function of jth Zernike coefficient $c_j$. Additionally, total changes of the coefficients $b_i$ can be expressed as the summation of $\Delta b_i(c_j)$ from $Z_2$ to Zn. In these cases, equation (7) can be represented as:

$$b_{i(with\_aberration)} = b_{i(w/o\_aberration)} + \sum_{j=2}^{n} \Delta b_i(cj) \quad (8)$$

$$= b_{i(w/o\_aberration)} + \sum_{j=2}^{n} \varphi_{0(i,j)} + \varphi_{1(i,j)} c_j +$$

$$\varphi_{2(i,j)} c_j^2 + \varphi_{3(i,j)} c_j^3 \ldots + \varphi_{n(i,j)} c_j^n$$

As a result, five coefficients $b_0 \ldots b_4$ are obtained for each simulation pixel if a set of Zernike coefficients are provided. Aerial image intensity or amplitude at the location of the simulation pixel for arbitrary defocus position is captured by the equation (4). Also, the $4^{th}$ order fitting function then provides the image intensity or amplitude at any defocus position.

After the calculation of the aerial image intensity or amplitude, input of the nominal slice level (equals threshold applied to the aerial image profile data) provides the estimation of image width (e.g., "CD" (critical dimension)) including any impacts due to aberration and defocus. In the case of calculating estimated CDs from image profiles built in accordance with the invention, it is desirable to include those simulation pixels which are within close proximity to the appropriate portion of the aerial image profile. So while the above explanation indicates that the coefficient sets for all simulation pixels are determined from the setup simulations and subsequently used in the image profile reconstruction, in practice all of the simulation pixels' coefficients sets except in the region near the slice level intersection with the aerial image profile are not necessary to be calculated. When applied to this application, the calculation volume is quite small.

Figure 5:
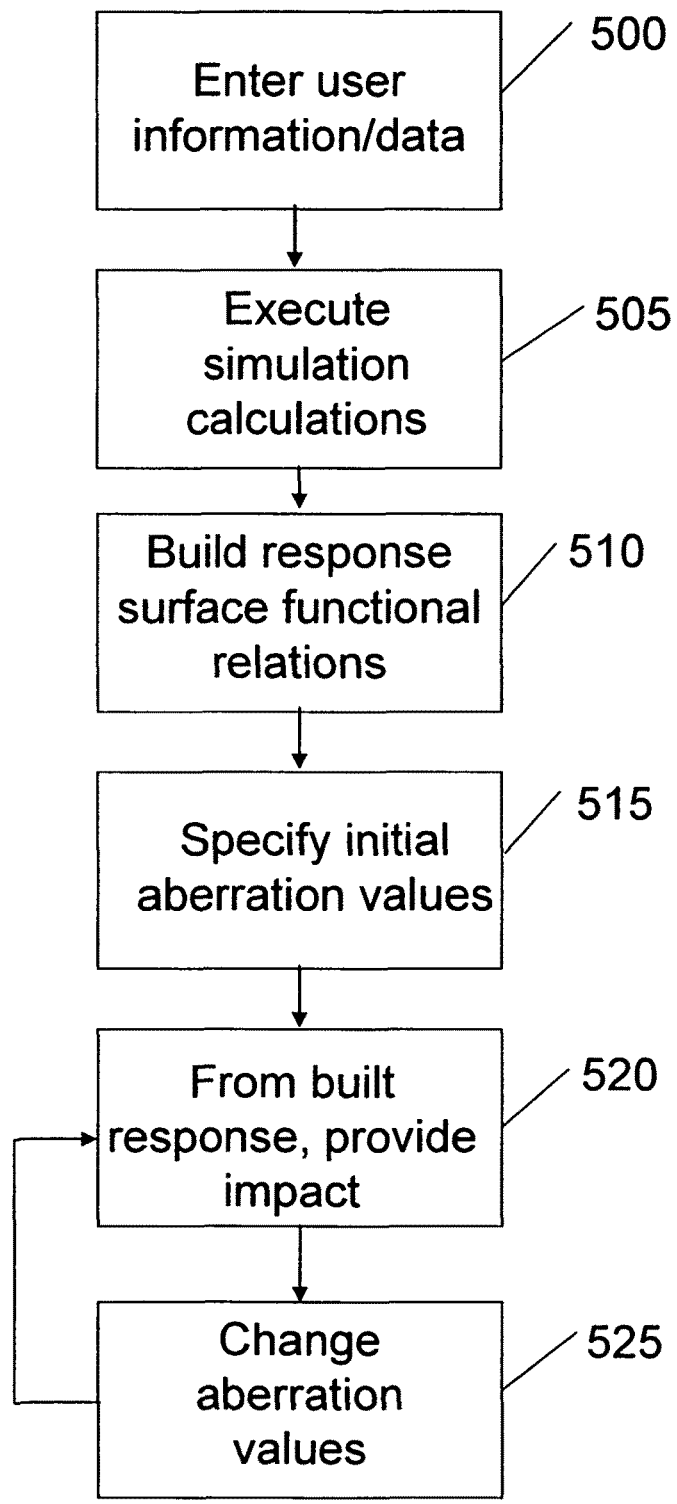
FIG. 5 shows a flow diagram implementing the steps in accordance with the invention.

FIG. 5 is a flow diagram showing the steps of one implementation of the invention using the above equations to calculate response surface functional relations. FIG. 5 may equally represent a high level block diagram of the invention. The steps shown in FIG. 5 may be representative of a computer software program or hardwired circuit used to implement the invention. In the case of software, the program can be stored on media such as, for example, magnetic media (e.g., diskette, tape, or fixed disc) or optical media such as a CD-ROM. Additionally, the software can be supplied via the Internet or some other type of network. A workstation or personal computer that typically runs the software includes a plurality of input/output devices and a system unit that includes both hardware and software necessary to provide the tools to execute the method of the invention.

The flow diagram of FIG. 5 summarizes a typical lens optimization task using the invention. As shown in the flow of FIG. 5, each time a new lens adjustment is considered, a new set of aberration component values is generated. But, instead of requiring a calculation each and every time a new aberration is provided, the system and method of the invention uses the created look up table, e.g., built response surface functional relations, comprising the aberration simulation data. The system and method of the invention then interpolates the data points in the look up table to provide a new image profile using a new combination of aberration components. That is, the system and method of the invention interpolates the built response surface functional relations in order to achieve an image profile, for example, using new aberration components.

At step 500, a user enters specified data concerning the image configuration characteristics. These characteristics may include, for example, lens data, illumination data and pattern data. The illumination data may include at least one of illumination distribution (e.g., partial coherence sigma) and illumination wavelength, and the lens data may include at least one of lens aberration, numerical aperture, pupil filters and lens configuration. The pattern data may include object (reticle pattern) layout.

At step 505, the simulation calculations are performed for various levels of each aberration component (e.g., Zernike term). The result of this step is to provide the data necessary to program the image profile calculator. This data will then be used during the looped evaluation of many aberration combination values, as set forth in steps 520 and 525, for example. It should be understood by those of ordinary skill in the art that each different aberration value applied leads to one full image simulation calculation, and that by using the method and system of the invention, it is no longer necessary to calculate image profiles for each and every new aberration component provided by a user (which may results in thousands of calculations).

At step 510, the process of the invention builds response surface function relations between any of the variable position, intensity or amplitude, focus and all component aberration levels included in the simulation of step 505. The response surface function relations may be used as the look up table in the calculation of different aberration components to optimize image profiles. The response surface function relations are created using equations 6 and 8, above, for example.

At step 515, the user specifies the initial aberration values to be used in a new simulation. These aberration values may be obtained from a design of the lens. At step 520, the process of the invention sums the impact from all specified aberration coefficients from the response surface built for each aberration. That is, the processes use the calculated values of the aberration components, e.g., data points, and interpolates such data to coincide with the given aberration components in order to achieve a known image profile and the like. These new aberration components may be the coefficients $b_0 \ldots b_n$, for example, now used in equation 6. The output is intensity or amplitude vs. position and/or focus for any arbitrary set of aberration values. As discussed above, each calculation is a simple evaluation of a fixed function.

At step 525, a user may change the aberration values and, at step 520, the calculation may be again performed for the changed values. Thus, by using the system and method of the invention, intensive and time consuming calculations do not have to be performed for each and every new aberration component.

Figure 6:
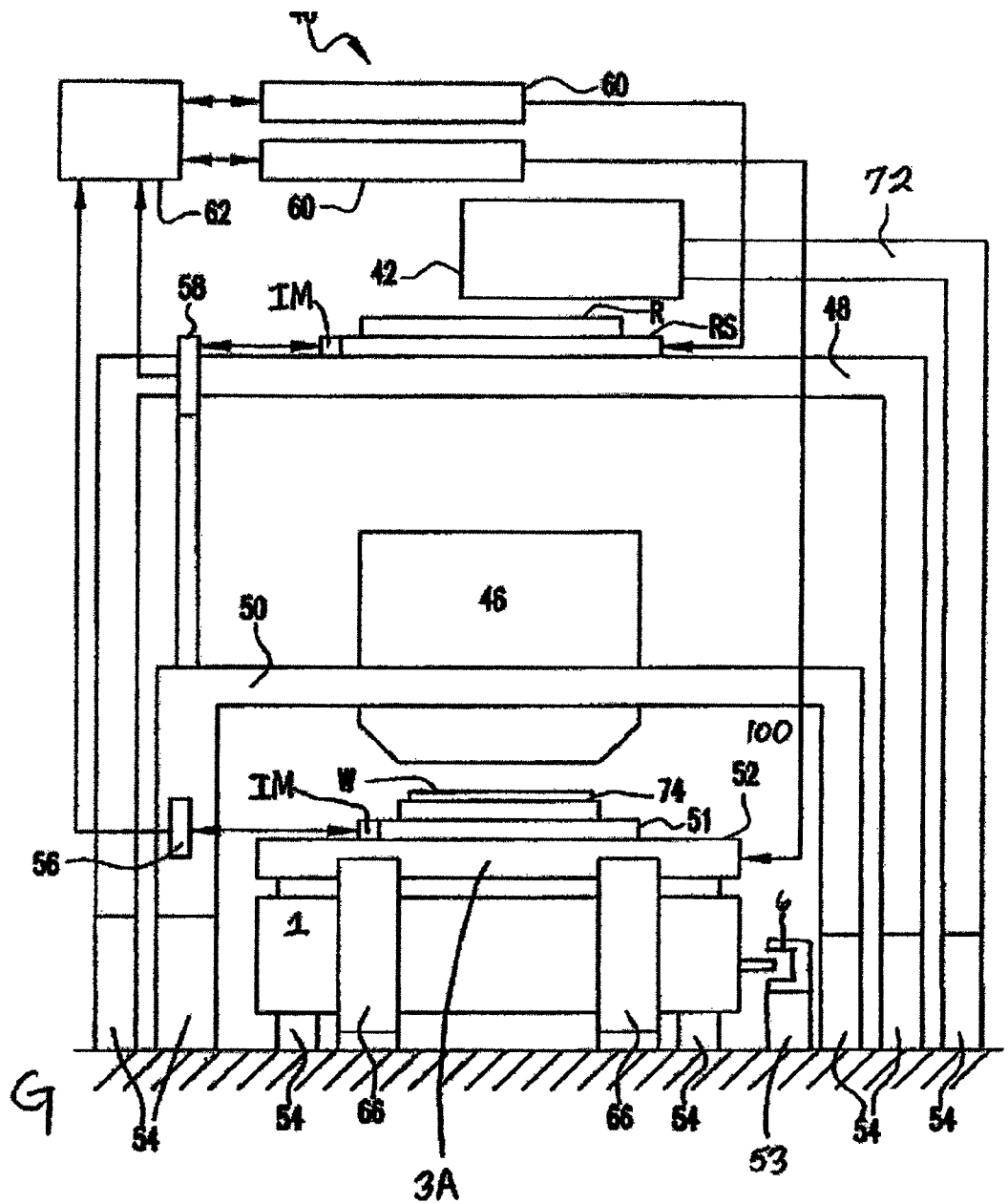
FIG. 6 is a schematic view illustrating a photolithography apparatus according to the invention.

FIG. 6 is a schematic view illustrating a photolithography apparatus (exposure apparatus) 40 in accordance with the invention. The wafer positioning stage 52 includes a wafer stage 51, a base 1, a following stage 3A, a following stage base 3A, and an additional actuator 6. The wafer stage 51 comprises a wafer chuck 120 that holds a wafer 130 and an interferometer mirror IM. The base 1 is supported by a plurality of isolators 54 (or a reaction frame). The isolator 54 may include a gimbal air bearing 105. The following stage base 3A is supported by a wafer stage frame (reaction frame) 66. The additional actuator 6 is supported on the ground G through a reaction frame 53. The wafer positioning stage 52 is structured so that it can move the wafer stage 51 in multiple (e.g., three to six) degrees of freedom under precision control by a drive control unit 140 and system controller 30, and position and orient the wafer 130 as desired relative to the projection optics 46. In this embodiment, the wafer stage 51 has six degrees of freedom by utilizing the Z direction forces generated by the x motor and the y motor of the wafer positioning stage 52 to control a leveling of the wafer 130. However, a wafer table having three degrees of freedom (Z, θx, θy) or six degrees of freedom can be attached to the wafer stage 51 to control the leveling of the wafer. The wafer table includes the wafer chuck 120, at least three voice coil motors (not shown), and bearing system. The wafer table is levitated in the vertical plane by the voice coil motors and supported on the wafer stage 51 by the bearing system so that the wafer table can move relative to the wafer stage 51.

The reaction force generated by the wafer stage 51 motion in the X direction can be canceled by motion of the base 1 and the additional actuator 6. Further, the reaction force generated by the wafer stage motion in the Y direction can be canceled by the motion of the following stage base 3A.

An illumination system 42 is supported by a frame 72. The illumination system 42 projects radiant energy (e.g., light) through a mask pattern on a reticle R that is supported by and scanned using a reticle stage RS. In one embodiment, the reticle stage RS may have a reticle coarse stage for coarse motion and a reticle fine stage for fine motion. In this case, the reticle coarse stage correspond to the translation stage table 100, with one degree of freedom. The reaction force generated by the motion of the reticle stage RS can be mechanically released to the ground through a reticle stage frame 48 and the isolator 54, in accordance with the structures described in JP Hei 8-330224 and U.S. Pat. No. 5,874,820, the entire contents of which are incorporated by reference herein. The light is focused through a projection optical system (lens assembly)

46 supported on a projection optics frame 75 and released to the ground through isolator 54.

An interferometer 56 is supported on the projection optics frame 75 and detects the position of the wafer stage 51 and outputs the information of the position of the wafer stage 51 to the system controller 30. A second interferometer 58 is supported on the projection optics frame 75 and detects the position of the reticle stage RS and outputs the information of the position to the system controller 30. The system controller 30 controls a drive control unit 140 to position the reticle R at a desired position and orientation relative to the wafer 130 or the projection optics 46. By using the system and method of the present invention, accuracy of the interferometer is maintained.

There are a number of different types of photolithographic devices. For example, apparatus 70 may comprise an exposure apparatus that can be used as a scanning type photolithography system, which exposes the pattern from reticle R onto wafer 130 with reticle R and wafer 130 moving synchronously. In a scanning type lithographic device, reticle R is moved perpendicular to an optical axis of projection optics 46 by reticle stage RS and wafer 130 is moved perpendicular to an optical axis of projection optics 46 by wafer positioning stage 52. Scanning of reticle R and wafer 130 occurs while reticle R and wafer 130 are moving synchronously but in opposite directions along mutually parallel axes parallel to the x-axis.

Alternatively, exposure apparatus 70 can be a step-and-repeat type photolithography system that exposes reticle R while reticle R and wafer 130 are stationary. In the step and repeat process, wafer 130 is in a fixed position relative to reticle R and projection optics 46 during the exposure of an individual field. Subsequently, between consecutive exposure steps, wafer 130 is consecutively moved by wafer positioning stage 52 perpendicular to the optical axis of projection optics 46 so that the next field of semiconductor wafer 130 is brought into position relative to projection optics 46 and reticle R for exposure. Following this process, the images on reticle R are sequentially exposed onto the fields of wafer 130 so that the next field of semiconductor wafer 130 is brought into position relative to projection optics 46 and reticle R.

However, the use of apparatus 70 provided herein is not limited to a photolithography system for semiconductor manufacturing. Apparatus 70 (e.g., an exposure apparatus), for example can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

In the illumination system 42, the illumination source can be g-line (436 nm), i-line (365 µm), KrF excimer laser (248 µm), ArF excimer laser (193 nm) or $F_2$ laser (157 µm). Alternatively, the illumination source can also use charged particle beams such as x-rays and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

With respect to projection optics 46, when far ultra-violet rays such as the excimer laser is used, glass materials such as quartz and fluorite that transmit far ultra-violet rays are preferably used. When the $F_2$ type laser or x-rays are used, projection optics 46 should preferably be either catadioptric or refractive (a reticle should also preferably be a reflective type), and when an electron beam is used, electron optics should preferably comprise electron lenses and deflectors. The optical path for the electron beams should be traced in vacuum.

Also, with an exposure device that employs vacuum ultra-violet radiation (VUV) of wavelength 200 nm or shorter, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japanese Patent Application Disclosure No. 10-20195 and its counterpart U.S. Pat. No. 5,835,275. In these cases, the reflecting optical device can be a catadioptric optical system incorporating a beam splitter and concave mirror. Japanese Patent Application Disclosure No. 8-334695 published in the Official Gazette for Laid-Open Patent Applications and its counterpart U.S. Pat. No. 5,689,377 as well as Japanese Patent Application Disclosure No. 10-3039 and its counterpart U.S. Pat. No. 5,892,117 also use a reflecting-refracting type of optical system incorporating a concave mirror, etc., but without a beam splitter, and can also be employed with this invention. The disclosures in the above-mentioned U.S. patents, as well as the Japanese patent applications published in the Office Gazette for Laid-Open Patent Applications are incorporated herein by reference.

Further, in photolithography systems, when linear motors that differ from the motors shown in the above embodiments (see U.S. Pat. Nos. 5,623,853 or 5,528,118) are used in one of a wafer stage or a reticle stage, the linear motors can be either an air levitation type employing air bearings or a magnetic levitation type using Lorentz force or reactance force. Additionally, the stage could move along a guide, or it could be a guideless type stage that uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage with the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that accuracy is maintained in the complete photolithography system. Additionally, it is desirable to manufacture an exposure system in a clean room where the temperature and humidity are controlled.

Figure 7:
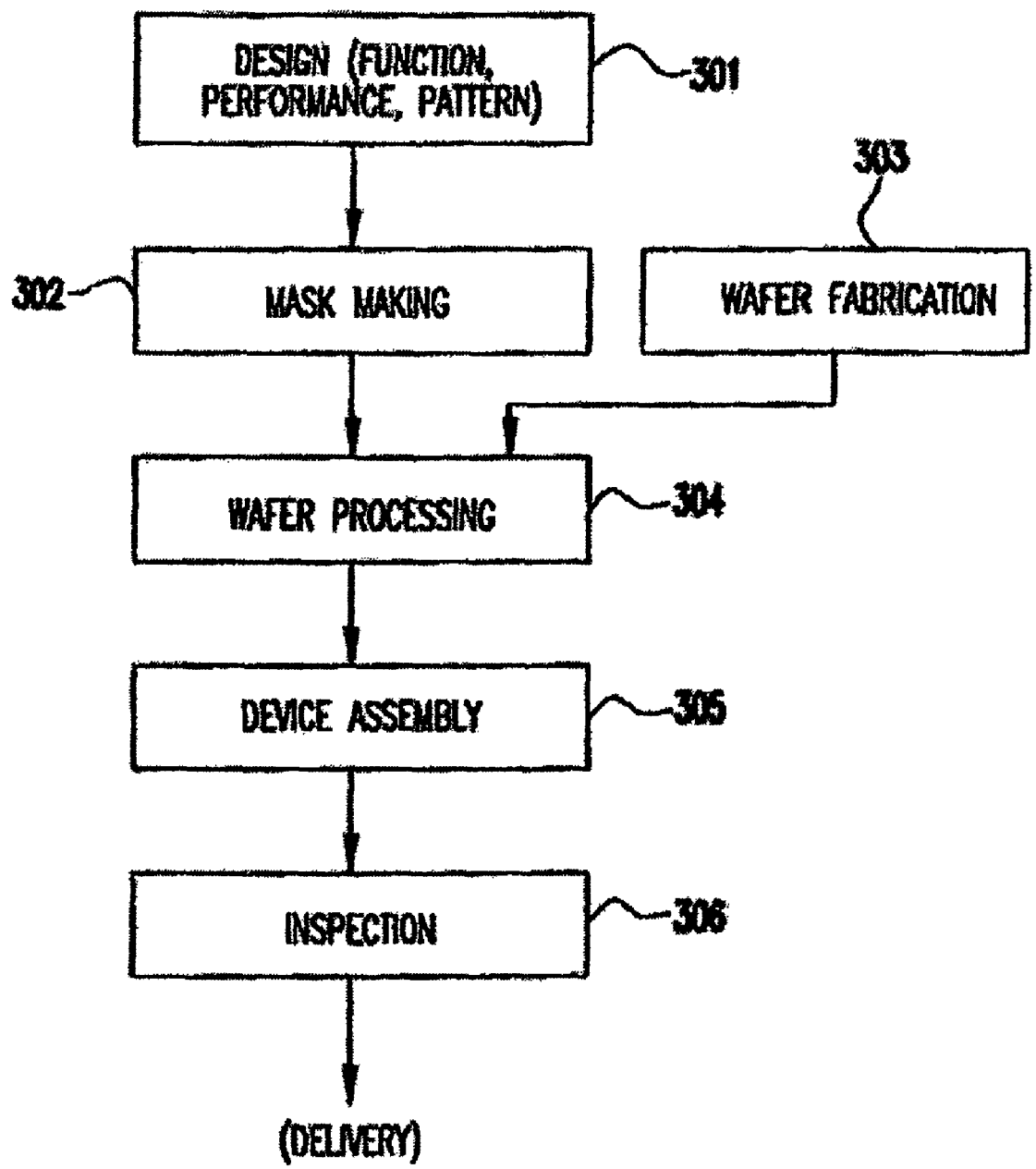
FIG. 7 is a flow chart showing semiconductor device fabrication.

Further, semiconductor devices can be fabricated using the above described systems, by the process shown generally in FIG. 7. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system described hereinabove consistent with the principles of the present invention. In step 305 the semiconductor device is assembled (including the dicing process, bonding process and packaging process), then finally the device is inspected in step 306.

Figure 8:
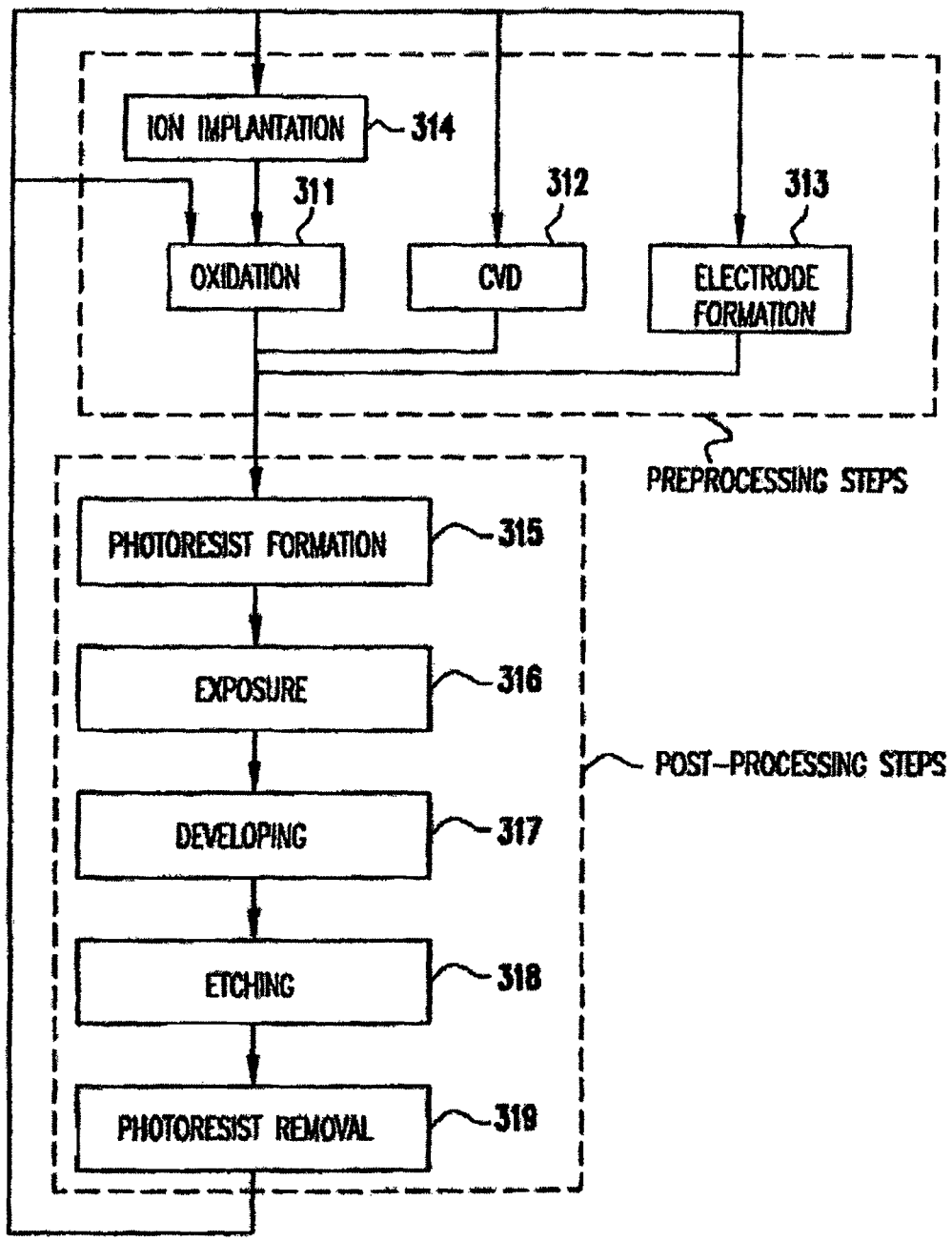
FIG. 8 is a flow chart showing wafer processing.

FIG. 8 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above-mentioned steps 311-314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially in step 315 (photoresist formation step), photoresist is applied to a wafer. Next, in step 316 (exposure step), the above-mentioned exposure apparatus is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these pre-processing and post-processing steps.

Implementations of the System and Method of the Invention

The system and method of the invention may be implemented to provide several resultant scenarios. For example, the following implementations are possible, as illustrations:

Image Profile Intensity or Amplitude

The system and invention may be implemented to calculate image profile intensity or amplitude values as a function of some combination of position in image field, focus, and aberration value. In this implementation, the above equations (6) and (8), or others performing an equivalent fitting of the data and transformation into a set of coefficients, may be used in both "in air" and as "captured in photoresist" image profiles. Coefficients determined in this manner serve to build response surface(s) which provide a direct functional description of the response of intensity or amplitude vs. image field position and focus (i.e., generate fit coefficients describing aerial image intensity or amplitude as a function of some combination of position, focus, and aberration magnitude).

Once the response surfaces have been built, as described above, the system and method can then "reconstruct" aberrated image profiles for any combination of aberration values through a linear summation of identified aberration components, e.g. Zernike Series as one definition of aberration components. This could include products of Zernike Coefficients as separately defined aberration components (i.e., 'aberration cross-terms).

Now, using the system and method of the invention, each reconstruction of another arbitrary combination of aberration values requires a simple plug-in of aberration values, with a straightforward evaluation of a simple equation (that employing the $b_0 \ldots b_4$ coefficients in the example previously described) being all that is required to determine the "intensity or amplitude vs. position and focus" distribution for any specified aberration value set. This distribution is one form of Image Profile. Thus, following the setup simulations, Image Profiles have been directly calculated without the use of further full direct image simulation calculation. These surface plot equations representing the Image Profile relate to the interpolation process used with the invention.

Developed Resist Image

Much like described in the first implementation (Image Profile Intensity or amplitude), the system and method of the invention may be implemented to fit to complete image profile resist thickness and/or width values as a function of some combination of position in image field, focus, and aberration value.

This can be implemented using the reconstruct as described throughout the description, by those of ordinary skill in the art. That is, using known software packages such as Prolith™, image profile resist thickness and/or width values can be calculated using the look up table of the invention, as a last step in a simulation calculation. In effect, the descriptions and Figures presented regarding the Intensity or amplitude Image Profile can be applied to the Developed Resist Image Profile, with the simple substitution of "resist thickness" for "intensity" in any of the graphs and plots.

Etched Image Profile

Much like described in the first implementation (Image Profile Intensity or amplitude), the invention may be implemented to calculate the "Etched Image Profile". This is accomplished by fit to complete layer thickness and/or width in exposed substrate layer values as a function of some combination of position in image field, focus, and aberration value, using the reconstruct as described above.

In effect, the descriptions and Figures presented regarding the Intensity or amplitude Image Profile can be applied to the Etched Image Profile, with the simple substitution of "film thickness" for "intensity" in any of the graphs and plots.

Deviation Calculations

The invention may be implemented to fit to impact upon (deviation from) an ideal (no lens aberration) simulated aerial image intensity or amplitude in both "in air" and as "captured in photoresist" image profiles. To accomplish this method, reconstruction proceeds as described, with the exception that the final determined impact on aerial image intensity or amplitude is added to the aberration-free aerial image intensity profile (vs. position and focus).

Developed Resist Image Profile

The invention may be implemented to fit to Impact upon (deviation from) an ideal (no lens aberration) simulated complete set of image profile resist thickness and/or width values as a function of some combination of position in image field, focus, and aberration value, in accordance with the implementation of deviation calculations.

Etched Image Profile

The invention may be implemented to fit to impact upon (deviation from) an ideal (no lens aberration) simulated layer thickness and/or width in exposed substrate layer values as a function of some combination of position in image field, focus, and aberration value, in accordance with the implementation of deviation calculations.

EXAMPLE OF USING THE SYSTEM Of METHOD OF THE INVENTION

As an illustrative example, consider the task of optimizing the adjustment of microlithography projection lens towards the goal of maximum performance in the imaging of some specified pattern or patterns. It is well established that different patterns illuminate (i.e. utilize) different portions of the projection lens pupil when being exposed. This results from the optical process of diffraction, which directs light into different angular distributions depending upon the object pattern being imaged. Hence, it may be possible that different lens adjustments may lead to optimized imaging performance between such different patterns.

In order to assist in the determination of such an optimized lens adjustment prescription for a pattern or combination of patterns, the invention may be applied such that all actual image simulation calculations (i.e., the simulation of the propagation of light from the object plane, through the projection lens containing a specified combination of aberration components, and finally to the image plane where it ultimately yields an image profile) are executed prior to the optimization. Further, these "set-up" simulation executions need only be executed once for each defined pattern, and the results can be applied and re-used at any time in the future, requiring only an input set of aberration component values. In effect, the simulations serve to "load" the "Image Profile Calculator", i.e., the reconstruct having the calculated data points, which then applies the methods of the invention to reconstruct image profiles from any subsequently input set of aberration component values.

While the invention has been described in terms of embodiments, those skilled in the art will recognize that the invention can be practiced with modification within the spirit and scope of the appended claims.

I claim:

1. A method of calculating estimated image profiles implemented on a tangibly-embodied storage medium resident on one or more computing devices, comprising the steps of:
providing imaging configuration characteristic data;
performing simulation calculations for various levels for each aberration component using the imaging configuration characteristic data using a processor of the one or more computing devices;
building response surface functional relations using the processor of the one or more computing devices between variables of lens characteristics and an image profile of interest using the simulation calculations; and
evaluating specified aberration values of a lens in relation to the response surface functional relations using the processor of the one or more computing devices to provide an estimate of the image profile in a presence of specified aberration(s), wherein the building steps includes:
providing an order fitting function expressed as:

$$I_{spx}(x)=b_0+b_1x+b_2x^2+b_3x^3+\ldots+b_nx^n$$

where $I_{spx}$ is aerial image intensity or amplitude at a simulation pixel (spx) and x indicates defocus; and expressing a change of the coefficients $b_0 \ldots b_n$ described by an order fitting function expressed as:

$$b_{i(with\_aberration)} = b_{i(w/o\_aberration)} + \sum_{j=2}^{Zn} \Delta b_i(cj)$$

$$= b_{i(w/o\_aberration)} + \sum_{j=2}^{Zn} \varphi_{0(i,j)} + \varphi_{1(i,j)}c_j + \varphi_{2(i,j)}c_j^2 +$$

$$\varphi_{3(i,j)}c_j^3 + \ldots + \varphi_{n(i,j)}c_j^n$$

wherein

=0, 1, 2, 3, ..., n;

$b_{i(with\ aberration)}$ and $b_{i(w/o\ aberration)}$ represents one of the coefficients $b_0 \ldots b_n$ influenced by lens aberrations and the coefficients $b_0 \ldots b_n$ without aberrations, respectively, and $\Delta bi$ indicates the change in coefficients and is expressed by an $n^{th}$ order fitting function of jth Zernike coefficient $c_j$, $\phi_{0(ij)} \ldots \phi_{n(ij)}$ are the coefficients of the fitting function, determined following the performing step of setup simulations of image profile as a function of regularly iterated values of lens aberration.

2. The method of claim 1, wherein the fit coefficients $\phi_{0(ij)} \ldots \phi_{n(ij)}$ are generated from a single aberration polynomial coefficient or from at least one of multiplication division of one aberration polynomial coefficient by another.

3. The method of claim 1, wherein the coefficients $b_0 \ldots b_n$ are stored for each simulation calculation following their determination via fitting to the simulation calculation of the performing step.

4. The method of claim 1, wherein n=4.

5. The method of claim 1, wherein Zn=37.

6. A method of calculating estimated image profiles implemented on a tangibly-embodied storage medium resident on one or more computing devices, comprising the steps of:
performing simulation calculations using a processor of the one or more computing devices for various levels for each aberration component using image configuration characteristic data;
building response surface functional relations using the processor of the one or more computing devices between variables of the image configuration characteristics and the image profile of interest using the simulation calculations as data input to be fit using:

$$I_{spx}(x)=b_0+b_1x+b_2x^2+b_3x^3+\ldots+b_nx^n$$

where $I_{spx}$ indicates aerial image intensity or amplitude at a simulation pixel (spx) and x indicates defocus; and expressing a change of the coefficients $b_0 \ldots b_n$ using the processor of the one or more computing devices described by an order fitting function as:

$$b_{i(with\_aberration)} = b_{i(w/o\_aberration)} + \sum_{j=2}^{Zn} \Delta b_i(cj)$$

$$= b_{i(w/o\_aberration)} + \sum_{j=2}^{Zn} \varphi_{0(i,j)} + \varphi_{1(i,j)} c_j + \varphi_{2(i,j)} c_j^2 +$$

$$\varphi_{3(i,j)} c_j^3 + \ldots + \varphi_{n(i,j)} c_j^n$$

wherein
$b_{i(with\ aberration)}$ and $b_{i(w/o\ aberration)}$ represents the coefficients $b_0 \ldots b_n$ influenced by lens aberrations and the coefficients $b_0 \ldots b_n$, without aberrations, respectively,
$\Delta bi$ indicates the change in coefficients and it is expressed by an $n^{th}$ order fitting function of jth Zernike coefficient $c_j$; and
$\phi_{0(ij)} \ldots \phi_{n(ij)}$ are the coefficients of the fitting function; and
summing an impact from at least one of all new specified aberration coefficients and combinations of aberration coefficients from the built response surface functional relations using the processor of the one or more computing devices to provide lens adjustment data.

7. The method of claim 6, wherein the imaging configuration includes lens data, illumination data and pattern data.

8. The method of claim 6, wherein:
the illumination data includes at least one of illumination distribution and illumination wavelength;
the lens data includes at least one of lens aberration, numerical aperture, pupil filters and lens configuration; and
the pattern data includes object (reticle pattern) layout.

9. The method of claim 6, wherein the simulation calculations are provided for various levels of each aberration coefficient.

10. The method of claim 6, further comprising the step of generating a new set of aberration component values using the response surface functional relations each time a new lens adjustment is considered using the processor of the one or more computing devices.

11. The method of claim 6, wherein the summing step includes interpolating data points of data calculated by the simulation calculations to provide a new image profile associated with the new specified aberration coefficients.

12. The method of claim 6, wherein the coefficients $b_0 \ldots b_n$ are stored for each simulation calculation.

13. The method of claim 6, further comprising the steps of:
defining a simulation pixel as a unit of horizontal or vertical position into which aerial image is divided;
calculating aerial image intensity or amplitude for each simulation pixel; and
executing the image simulation calculations at defocus positions to provide image profile response to focus data.

14. The method of claim 6, wherein the response surface function relations are built between any of variables: (i) position, (ii) intensity or amplitude, (iii) focus, and (iv) all component aberration levels.

15. The method of claim 6, wherein the summing step provides an output of intensity or amplitude vs. at least one of position and focus for any arbitrary set of aberration values.

16. The method of claim 6, wherein n=4.

17. The method of claim 6, wherein Zn=37.

* * * * *

UNITED STATES PATENT AND TRADEMARK OFFICE
CERTIFICATE OF CORRECTION

PATENT NO. : 8,027,813 B2
APPLICATION NO. : 10/538763
DATED : September 27, 2011
INVENTOR(S) : Steven Douglas Slonaker It is certified that error appears in the above-identified patent and that said Letters Patent is hereby corrected as shown below:

Col. 24, Claim 1, line 29 – Change "= 0,1,2,3, .... , n" to "i= 0,1,2,3, .... , n"

Col. 24, Claim 1, line 36 – Change "$\Phi_{0(ij)} ... \Phi_{n(ij)}$" to "$\varphi_{0(i,j)} ... \varphi_{n(i,j)}$"

Col. 24, Claim 2, line 2 – Change "$\Phi_{0(ij)} ... \Phi_{n(ij)}$" to "$\varphi_{0(i,j)} ... \varphi_{n(i,j)}$"

Col. 25, Claim 6, lines 8-11 – Change

"$$= b_{i(w/o\_aberration)} + \sum_{j=2}^{Zn} \varphi_{0(i,j)} + \varphi_{1(i,j)}c_j + \varphi_{2(i,j)}c_j^2 +$$
$$\varphi_{3(i,j)}c_j^3 + ... + \varphi_{n(i,j)}c_j^n$$"

to

"$$= b_{i(w/o\_aberration)} + \sum_{j=2}^{Zn} \varphi_{0(i,j)} + \varphi_{1(i,j)}c_j + \varphi_{2(i,j)}c_j^2 + \varphi_{3(i,j)}c_j^3 + .... + \varphi_{n(i,j)}c_j^n$$"

Col. 25, Claim 6, line 21 – Change "$\Phi_{0(ij)} ... \Phi_{n(ij)}$" to "$\varphi_{0(i,j)} ... \varphi_{n(i,j)}$"

Signed and Sealed this
Thirty-first Day of January, 2012

David J. Kappos
*Director of the United States Patent and Trademark Office*